US012591018B2

(12) United States Patent
Omichi et al.

(10) Patent No.: US 12,591,018 B2
(45) Date of Patent: Mar. 31, 2026

(54) RESISTANCE CALCULATION DEVICE, RESISTANCE CALCULATION METHOD, AND PROGRAM

(71) Applicant: HONDA MOTOR CO., LTD., Tokyo (JP)

(72) Inventors: Kaoru Omichi, Wako (JP); Yurika Nishimoto, Wako (JP); Tadashi Kaga, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 462 days.

(21) Appl. No.: 18/122,161

(22) Filed: Mar. 16, 2023

(65) Prior Publication Data

US 2023/0314523 A1 Oct. 5, 2023

(30) Foreign Application Priority Data

Mar. 29, 2022 (JP) ................................. 2022-053523

(51) Int. Cl.
*G06F 11/30* (2006.01)
*G01R 31/36* (2020.01)
(Continued)

(52) U.S. Cl.
CPC ....... *G01R 31/389* (2019.01); *G01R 31/3648* (2013.01); *G01R 31/388* (2019.01); *G01R 31/392* (2019.01); *G01R 31/396* (2019.01)

(58) Field of Classification Search
CPC .................................................... G01R 31/389
See application file for complete search history.

(56) References Cited

U.S. PATENT DOCUMENTS

| | | | |
|---|---|---|---|
| 2011/0161025 A1 | 6/2011 | Tomura et al. | |
| 2015/0022157 A1 | 1/2015 | Takahashi | |
| 2022/0381845 A1 | 12/2022 | Yagi et al. | |

FOREIGN PATENT DOCUMENTS

| | | |
|---|---|---|
| JP | 2010-060384 | 3/2010 |
| JP | 2012-141202 | 7/2012 |

(Continued)

OTHER PUBLICATIONS

Japanese Notice Of Allowance for Japanese Patent Application No. 2022-053523 mailed Nov. 28, 2023.

*Primary Examiner* — Phuong Huynh
(74) *Attorney, Agent, or Firm* — Amin, Turocy & Watson, LLP

(57) ABSTRACT

A resistance calculation device includes: a characteristic calculation portion configured to calculate a shrinkage rate for each single electrode based on a capacity shift amount of a positive electrode of a deteriorated secondary battery, a capacity shift amount of a negative electrode of the deteriorated secondary battery, a deterioration amount of the positive electrode, and a deterioration amount of the negative electrode, and to calculate a curve representing characteristics of a state of charge and an open circuit voltage of an equivalent circuit of the deteriorated secondary battery by deforming an opening end potential curve for each single electrode before deterioration of the deteriorated secondary battery by the shrinkage rate for each single electrode based on a fixed point; a change amount calculation portion configured to calculate an amount of change in the open circuit voltage of the equivalent circuit based on a difference between the opening end potential curve for each single electrode before the deterioration and the curve representing the characteristics of the state of charge and the open circuit voltage of the equivalent circuit; and a resistance calculation portion configured to calculate a DC resistance of the (Continued)

equivalent circuit by dividing a result of addition of an amount of change in a DC voltage of the equivalent circuit to which a pulse current is applied and the amount of change in the open circuit voltage of the equivalent circuit by a current value when the pulse current is applied to the equivalent circuit.

5 Claims, 10 Drawing Sheets

(51) Int. Cl.
  *G01R 31/388* (2019.01)
  *G01R 31/389* (2019.01)
  *G01R 31/392* (2019.01)
  *G01R 31/396* (2019.01)

(56) References Cited

FOREIGN PATENT DOCUMENTS

| | | |
|---|---|---|
| JP | 2015-230817 | 12/2015 |
| JP | 2017-111058 | 6/2017 |
| JP | 2018-084549 | 5/2018 |
| JP | 2020-109367 | 7/2020 |
| JP | 2022-184419 | 12/2022 |
| WO | 2013/105140 | 7/2013 |
| WO | 2022/239188 | 11/2022 |

FIG. 8

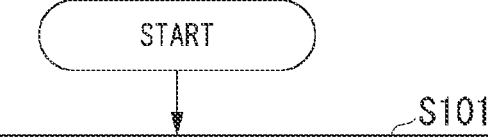

START

S101

ACQUIRE OPENING END POTENTIAL CURVE FOR
EACH SINGLE ELECTRODE BEFORE DETERIORATION
OF DETERIORATED SECONDARY BATTERY BY
DIFFERENTIAL ANALYSIS OF VOLTAGE AND CAPACITY
AND CHARGING AND DISCHARGING CURVE FITTING

S102

CALCULATE SHRINKAGE RATE FOR EACH SINGLE ELECTRODE
BASED ON CAPACITY SHIFT AMOUNT OF POSITIVE ELECTRODE
OF DETERIORATED SECONDARY BATTERY, CAPACITY SHIFT
AMOUNT OF NEGATIVE ELECTRODE OF DETERIORATED SECONDARY
BATTERY, DETERIORATION AMOUNT OF POSITIVE ELECTRODE,
AND DETERIORATION AMOUNT OF NEGATIVE ELECTRODE

S103

CALCULATE CURVE REPRESENTING CHARACTERISTICS OF
STATE OF CHARGE AND OPEN CIRCUIT VOLTAGE OF
EQUIVALENT CIRCUIT OF DETERIORATED SECONDARY
BATTERY BY DEFORMING OPENING END POTENTIAL CURVE
FOR EACH SINGLE ELECTRODE BEFORE DETERIORATION
OF DETERIORATED SECONDARY BATTERY BY SHRINKAGE
RATE FOR EACH SINGLE ELECTRODE BASED ON FIXED POINT

S104

CALCULATE AMOUNT OF CHANGE IN OPEN CIRCUIT VOLTAGE OF
EQUIVALENT CIRCUIT TO WHICH PULSE CURRENT IS APPLIED
BASED ON DIFFERENCE BETWEEN OPENING END POTENTIAL
CURVE FOR EACH SINGLE ELECTRODE BEFORE DETERIORATION
AND CURVE REPRESENTING CHARACTERISTICS OF STATE OF
CHARGE AND OPEN CIRCUIT VOLTAGE OF EQUIVALENT CIRCUIT

S105

CALCULATE DC RESISTANCE OF EQUIVALENT CIRCUIT
BY DIVIDING RESULT OF ADDING AMOUNT OF CHANGE
IN DC VOLTAGE OF EQUIVALENT CIRCUIT TO WHICH
PULSE CURRENT IS APPLIED AND AMOUNT OF
CHANGE IN OPEN CIRCUIT VOLTAGE OF EQUIVALENT
CIRCUIT BY CURRENT VALUE WHEN PULSE
CURRENT IS APPLIED TO EQUIVALENT CIRCUIT

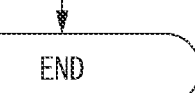

END

FIG. 11

RESISTANCE CALCULATION DEVICE, RESISTANCE CALCULATION METHOD, AND PROGRAM

CROSS-REFERENCE TO RELATED APPLICATION

Priority is claimed on Japanese Patent Application No. 2022-053523, filed on Mar. 29, 2022, the contents of which are incorporated herein by reference.

BACKGROUND

Field of the Invention

The present invention relates to a resistance calculation device, a resistance calculation method, and a program.

Background

In recent years, research and development on secondary batteries that contribute to energy efficiency has been carried out to ensure access to affordable, reliable, sustainable, and advanced energy for more people. In addition, there is growing interest in electric vehicles to reduce $CO_2$ emissions from a viewpoint of climate-related disasters, and the use of lithium-ion secondary batteries for in-vehicle applications is also being considered (as related documents, refer to, for example, Japanese Unexamined Patent Application, First Publication No. 2020-109367, Japanese Unexamined Patent Application, First Publication No. 2012-141202, and Japanese Unexamined Patent Application, First Publication No. 2017-111058).

SUMMARY

In the technology related to secondary batteries, the DC resistance (DC internal resistance) of a deteriorated secondary battery is calculated using an electrochemical equivalent circuit consisting of only a resistor and capacitance. However, the DC resistance of a secondary battery calculated using such an electrochemical equivalent circuit is inaccurate. In addition, a voltage drop amount of a deteriorated secondary battery is calculated using a curve representing characteristics of the state of charge (SOC) and open circuit voltage (OCV) before deterioration of the deteriorated secondary battery. However, the SOC-OCV curve changes depending on the deterioration of a secondary battery. Therefore, the DC resistance of a secondary battery calculated simply using the SOC-OCV curve is inaccurate.

A purpose of the present application is to improve an accuracy in calculation of the DC resistance of a deteriorated secondary battery. The present application will eventually contribute to energy efficiency.

A resistance calculation device according to a first aspect of the present invention includes: an acquisition portion configured to acquire an opening end potential curve for each single electrode before deterioration of a deteriorated secondary battery by a differential analysis of a voltage and a capacity and charging and discharging curve fitting; a characteristic calculation portion configured to calculate a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and to calculate a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point; a change amount calculation portion configured to calculate an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit; and a resistance calculation portion configured to calculate a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit.

A second aspect is the resistance calculation device according to the first aspect described above, wherein the equivalent circuit may include a constituent having impedance.

A third aspect of the present invention is a resistance calculation method that is executed by a computer of a resistance calculation device, the method including: acquiring an opening end potential curve for each single electrode before deterioration of a deteriorated secondary battery by a differential analysis of a voltage and a capacity and charging and discharging curve fitting; calculating a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and calculating a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point; calculating an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit; and calculating a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit.

A fourth aspect of the present invention is a computer-readable non-transitory recording medium that includes a program for causing a computer to execute: acquiring an opening end potential curve for each single electrode before deterioration of a deteriorated secondary battery by a differential analysis of a voltage and a capacity and charging and discharging curve fitting; calculating a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and calculating a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point; calculating an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit; and calculating a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit.

According to the first to fourth aspects, it is possible to improve an accuracy in calculation of a DC resistance of a deteriorated secondary battery.

BRIEF DESCRIPTION OF THE DRAWINGS

FIG. 8 is a flowchart which shows an operation example of the resistance calculation device.

FIG. 11 is a diagram which shows an example of analysis processing when a peak of a dV/dQ curve collapses when the dV/dQ curve is generated and the battery state is analyzed using the battery state measuring system according to the embodiment.

DESCRIPTION OF EMBODIMENTS

Hereinafter, embodiments of a resistance calculation device, a resistance calculation method, and a program of the present invention will be described with reference to the drawings.

[Overall Configuration]

Figure 1:
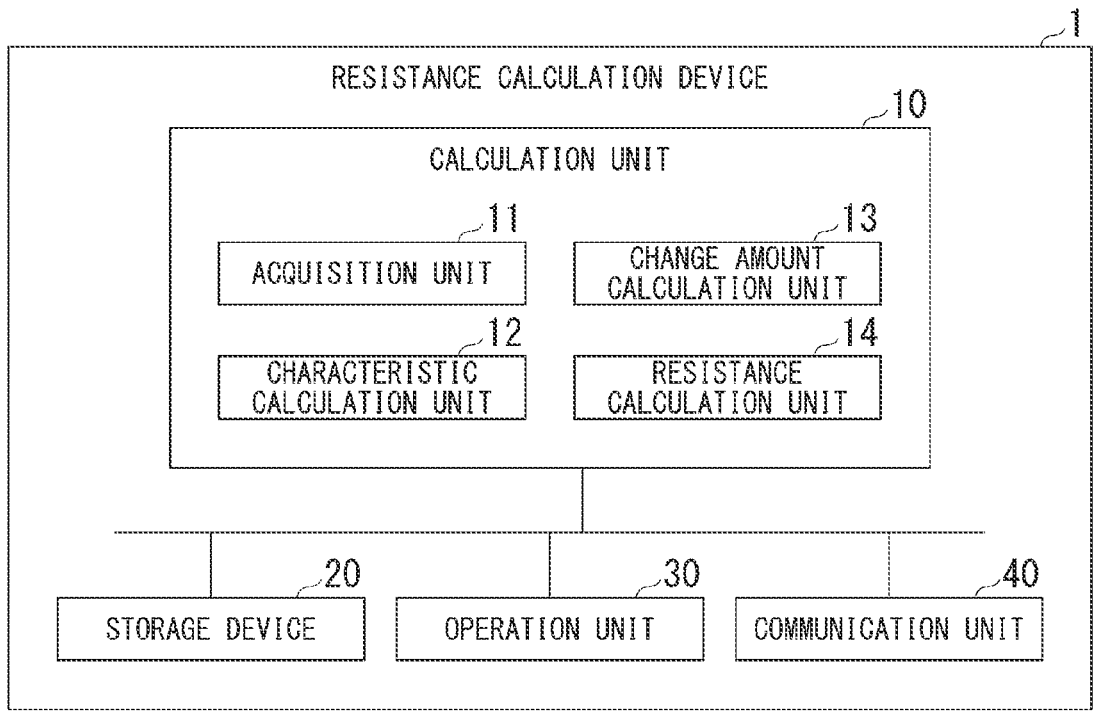
FIG. 1 is a diagram which shows a configuration example of a resistance calculation device according to an embodiment.

FIG. 1 is a diagram which shows a configuration example of a resistance calculation device 1 according to an embodiment. The resistance calculation device 1 is a simulation device that calculates an output of a deteriorated secondary battery. The resistance calculation device 1 predicts (extrapolates) a DC resistance of the deteriorated secondary battery at, for example, an arbitrary future time. The secondary battery is, for example, a lithium-ion battery.

The resistance calculation device 1 includes a calculation unit 10, a storage device 20, an operation unit 30, and a communication unit 40. The calculation unit 10 includes an acquisition unit 11 (acquisition portion), a characteristic calculation unit 12 (characteristic calculation portion), a change amount calculation unit 13 (change amount calculation portion), and a resistance calculation unit 14 (resistance calculation portion).

These components are realized by, for example, a hardware processor such as a central processing unit (CPU) executing a computer program (software). Some or all of these components may be realized by hardware (a circuit unit; including circuitry) such as a large scale integration (LSI), an application specific integrated circuit (ASIC), a field-programmable gate array (FPGA), and a graphics processing unit (GPU) or by software and hardware in cooperation. The program may be stored in advance in a storage device such as a hard disk drive (HDD) or flash memory (a storage device with a non-transitory storage medium), or may be stored in a detachable storage medium such as a DVD or CD-ROM (a non-transitory storage medium) and installed by the storage medium being attached to a drive device.

The storage device 20 stores a parameter representing characteristics of each constituent of an equivalent circuit of the secondary battery and a program executed by the calculation unit 10. The operation unit 30 is a device that receives an operation by a user, and is, for example, a keyboard, a mouse, or a touch panel. An operation by a user is, for example, an operation of inputting a parameter. The communication unit 40 executes communication with other devices (not shown). For example, the communication unit 40 transmits image data representing a result of calculation by the calculation unit 10 to a display device (not shown). For example, the communication unit 40 may also acquire a computer program and parameters for a simulation.

Figure 2:
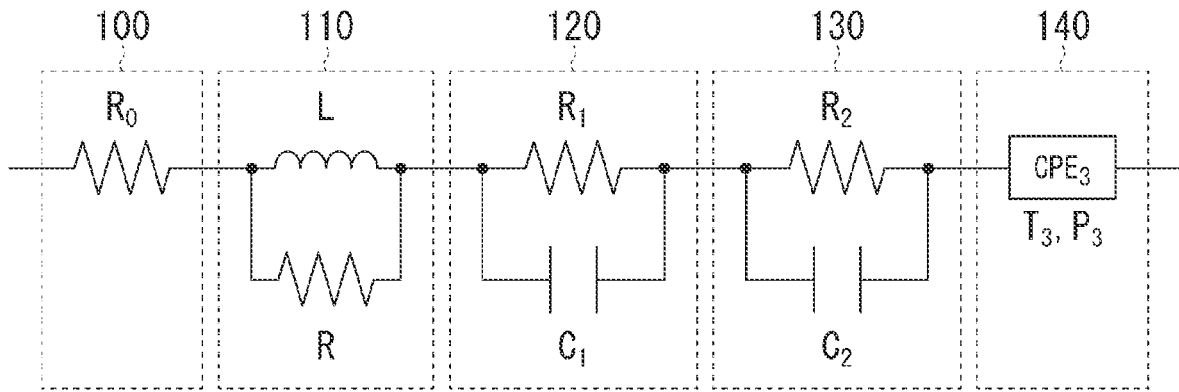
FIG. 2 is a diagram which shows an example of an equivalent circuit of a secondary battery according to the embodiment.

FIG. 2 is a diagram which shows an example of the equivalent circuit of the secondary battery according to the embodiment. The equivalent circuit exemplified in FIG. 2 is a characteristic model (an electrochemically equivalent virtual circuit) of the secondary battery. The equivalent circuit includes a resistor 100 "$R_0$," a coil resistor 110 "RL," a negative electrode resistance unit 120 "$R_1C_1$," a positive electrode resistance unit 130 "$R_2C_2$," and a pseudo-capacity unit 140. The pseudo-capacity unit 140 is represented using a capacity of a constant phase element "CPE$_3$." The capacity of the constant phase element is represented using a CPE constant "T$_3$" and a CPE exponent "P$_3$."

A worker (not shown) executes disassembly and characteristic measurement of a secondary battery to be predicted for the secondary battery before deterioration (at an initial stage) and the secondary battery after deterioration. For example, the worker (not shown) executes impedance measurement of the secondary battery to be predicted for a secondary battery to be predicted for the secondary battery before deterioration (at the initial stage) and the secondary battery after deterioration. As a result, each parameter of the coil resistor 110 is obtained in advance. An equivalent circuit is represented as in Equation (1).

[Math 1]

$$v(t) = \left\{ R_0 + R*e^{-\frac{R}{L}t} + R_1\left(1 - e^{-\frac{t}{C_1 R_1}}\right) + R_2\left(1 - e^{-\frac{t}{C_2 R_2}}\right) + \frac{t^{P_3}}{T_3 \Gamma(P_3 + 1)} \right\} * I_n \qquad (1)$$

Here, "v(t)" represents an amount of change in DC voltage (a voltage drop) "ΔV" at a time "t" when a DC current (a pulse current) is applied to the equivalent circuit. "I$_n$" represents an amount of direct current (pulse current) at the time "t." A result obtained by dividing "v(t)" by "I$_n$" represents a DC resistance (DCR: Direct Current Resistance).

"R$_0$" is a parameter corresponding to a resistor 100. "R*e$^{R/Lt}$" is a parameter corresponding to the coil resistor 110. In this manner, the equivalent circuit represented by Equation (1) includes a constituent (a coil) having impedance. "R$_1$ (1−e$^{t/C1R1}$)" is a parameter corresponding to the negative electrode resistance unit 120. "R$_2$ (1−e$_{t/C2R2}$)" is a parameter corresponding to the positive electrode resistance unit 130. "t$^{P3}$/T$_3$Γ(P$_3$+1)" is a parameter corresponding to the pseudo-capacity unit 140. The acquisition unit 11 acquires each parameter from the storage device 20, the operation unit 30, or the communication unit 40.

Figure 3:
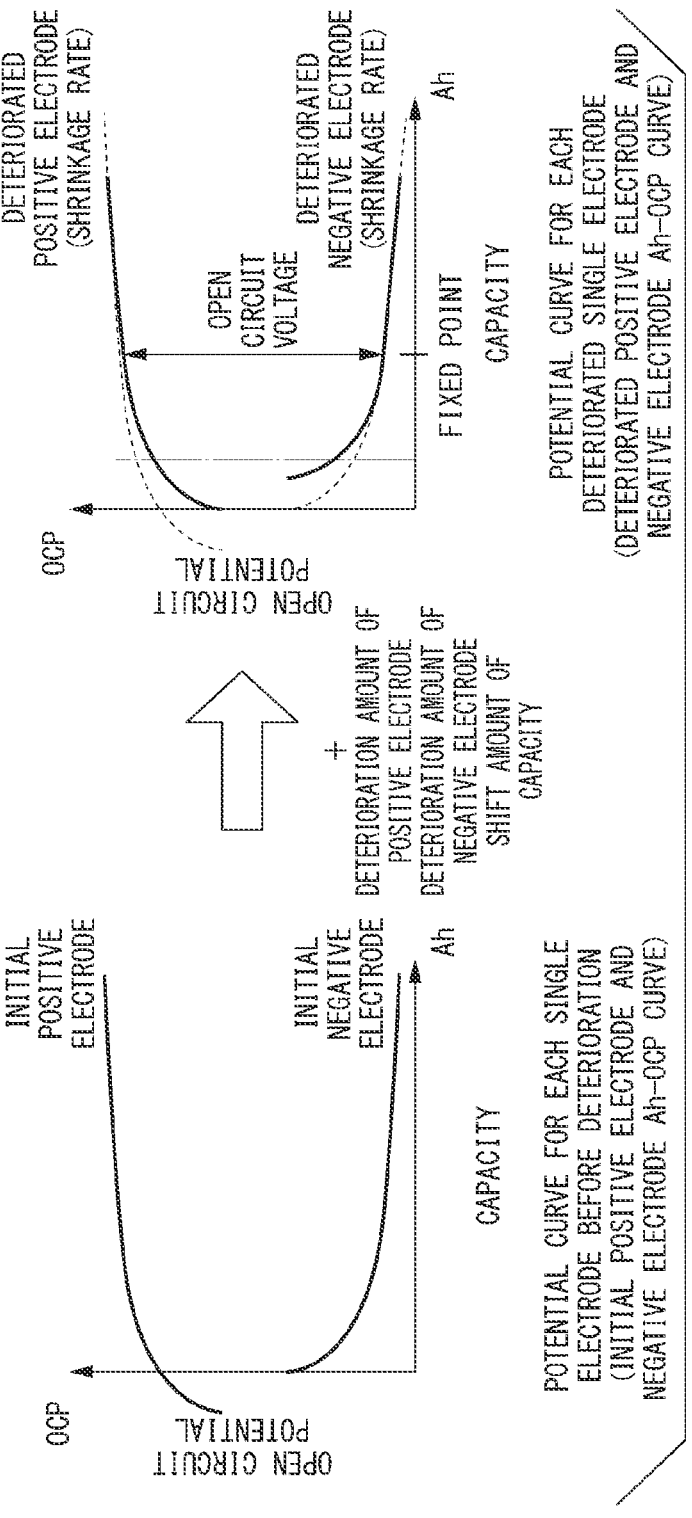
FIG. 3 is a diagram which shows an example of a relationship between a single electrode potential of the secondary battery before deterioration and a single electrode potential of an equivalent circuit of a deteriorated secondary battery.

FIG. 3 is a diagram which shows an example of a relationship between a single electrode potential of a secondary battery before deterioration and a single electrode potential of an equivalent circuit of the deteriorated secondary battery. The horizontal axis represents a capacity "Q" (Ah). The vertical axis represents an open circuit potential (OCP). A graph on the left side in FIG. 3 represents an opening end potential curve (a charging and discharging curve) for each single electrode before deterioration (at an initial stage). A graph on the right side in FIG. 3 represents an opening end potential curve (a charging and discharging curve) for each single electrode after deterioration.

The acquisition unit 11 acquires the opening end potential curve for each single electrode before deterioration of the deteriorated secondary battery by a dV/dQ analysis (a differential analysis of a voltage and a capacity) and charging and discharging curve fitting. The characteristic calculation unit 12 calculates a shrinkage rate of a positive electrode based on a capacity shift amount of the positive electrode of the decorated secondary battery and a deterioration amount of the positive electrode. The characteristic calculation unit 12 calculates a shrinkage rate of a negative electrode based on a capacity shift amount of the negative electrode of the deteriorated secondary battery and a deterioration amount of the negative electrode.

The characteristic calculation unit 12 calculates a curve representing characteristics of a state of charge and an open circuit voltage of the equivalent circuit of the deteriorated secondary battery by deforming the opening end potential curve for each single electrode before the deterioration of the deteriorated secondary battery by the shrinkage rate for each single electrode based on a fixed point.

The characteristic calculation unit 12 calculates the open circuit voltage of the equivalent circuit of the secondary battery before deterioration on the basis of a difference between a potential of the positive electrode before deterioration and a potential of the negative electrode before deterioration. The characteristic calculation unit 12 calculates the open circuit voltage of the equivalent circuit of the deteriorated secondary battery on the basis of a difference between a potential of the deteriorated positive electrode and a potential of the deteriorated negative electrode. As a result, the change amount calculation unit 13 can calculate a difference (an amount of change) between the open circuit voltage of the equivalent circuit of the secondary battery before deterioration and the open circuit voltage of the equivalent circuit of the deteriorated secondary battery, using a curve representing such characteristics as shown in FIG. 4 or 5.

Figure 4:
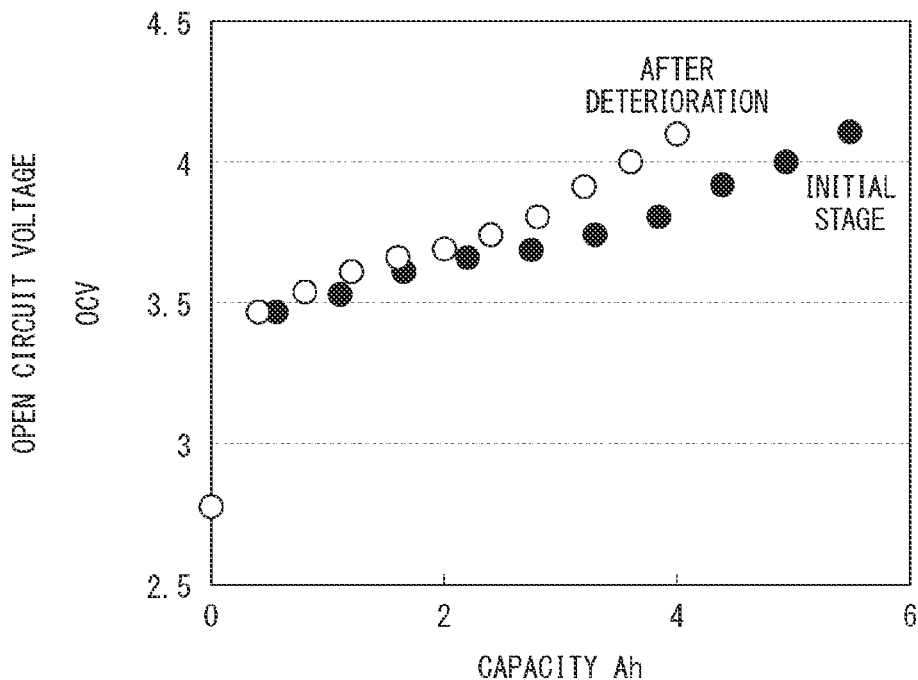
FIG. 4 is a diagram which represents an example of a relationship between a capacity and an open circuit voltage of the secondary battery before deterioration, and an example of a relationship of a capacity and an open circuit voltage of the deteriorated secondary battery.
Figure 5:
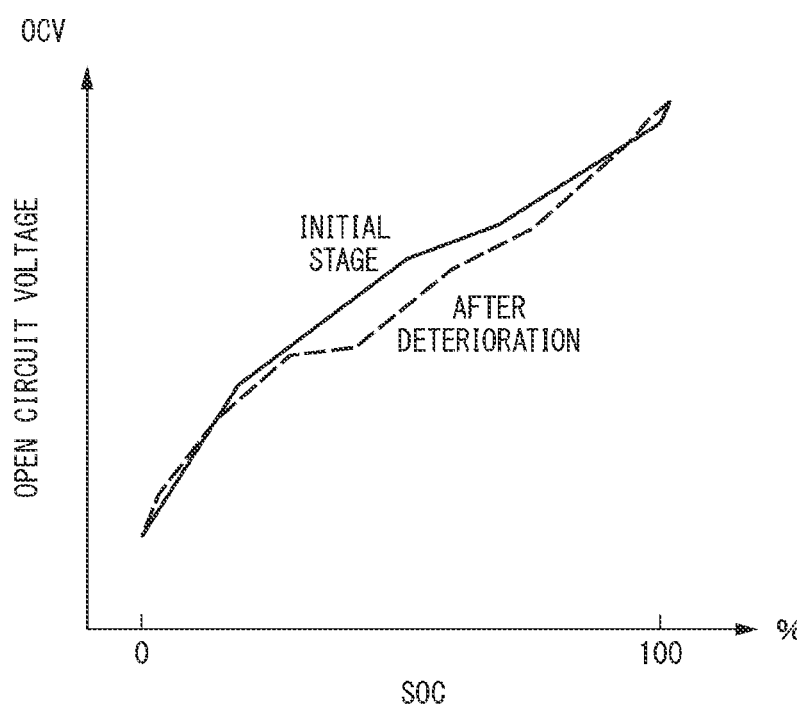
FIG. 5 is a diagram which shows an example of a relationship of a state of charge and the open circuit voltage of the secondary battery before deterioration and an example of a relationship of a state of charge and the open circuit voltage of the deteriorated secondary battery.

FIG. 4 is a diagram which shows an example of a relationship of a capacity and an open circuit voltage of the secondary battery before deterioration, and an example of a relationship of a capacity and an open circuit voltage of the deteriorated secondary battery. In a graph on the left side in FIG. 3, the difference between the potential of the positive electrode before deterioration and the potential of the negative electrode before deterioration represents the open circuit voltage of the equivalent circuit of the secondary battery before deterioration. The characteristic calculation unit 12 calculates a curve representing the characteristics of a capacity and an open circuit voltage of the equivalent circuit of the secondary battery before deterioration (at the initial stage) based on a potential curve for each single electrode before deterioration of the deteriorated secondary battery (the graph on the left side in FIG. 3).

The difference between the potential of the deteriorated positive electrode and the potential of the deteriorated negative electrode in the graph on the right side in FIG. 3 represents the open circuit voltage of the equivalent circuit of the deteriorated secondary battery. The characteristic calculation unit 12 calculates a curve representing characteristics of a capacity and an open circuit voltage of the equivalent circuit the secondary battery after deterioration based on a potential curve for each single electrode of the deteriorated secondary battery (the graph on the right side in FIG. 3).

The change amount calculation unit 13 calculates an amount of change "ΔOCV" in open circuit voltage of an equivalent circuit to which a pulse current is applied on the basis of a difference between the open circuit voltage of the equivalent circuit of the secondary battery before deterioration and the open circuit voltage of the equivalent circuit of the deteriorated secondary battery.

FIG. 5 is a diagram which shows an example of a relationship of the state of charge and the open circuit voltage of the secondary battery before deterioration, and an example of a relationship of the state of charge and the open circuit voltage of the deteriorated secondary battery. The characteristic calculation unit 12 may calculate the curve representing the characteristics of the state of charge and open circuit voltage of the equivalent circuit of the secondary battery before deterioration (at the initial stage) based on the potential curve for each single electrode before deterioration of the deteriorated secondary battery (the graph on the left side in FIG. 3).

The characteristic calculation unit 12 may calculate the curve representing the characteristics of the state of charge and open circuit voltage of the equivalent circuit of the secondary battery after deterioration based on the potential curve for each single electrode of the deteriorated secondary battery (the graph on the right side in FIG. 3). The change amount calculation unit 13 calculates the amount of change "ΔOCV" in the open circuit voltage of the equivalent circuit to which a pulse current is applied, on the basis of the difference between the open circuit voltage of the equivalent circuit of the secondary battery before deterioration and the open circuit voltage of the equivalent circuit of the deteriorated secondary battery.

Figure 6:
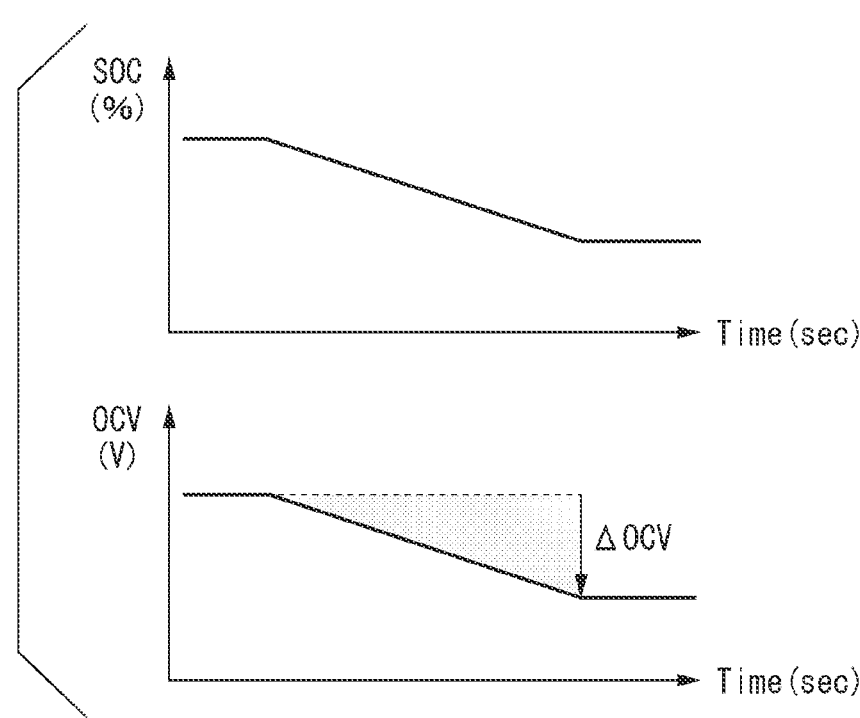
FIG. 6 is a diagram which shows an example of a relationship of a state of charge and an open circuit voltage of a secondary battery in chronological order.

FIG. 6 is a diagram which shows an example of a relationship of a state of charge and an open circuit voltage of the secondary battery in chronological order. FIG. 6 shows that the open circuit voltage decreases as the state of charge (%) decreases. That is, FIG. 6 shows that the amount of change (an IR drop amount) in the open circuit voltage increases as the state of charge (%) decreases.

Figure 7:
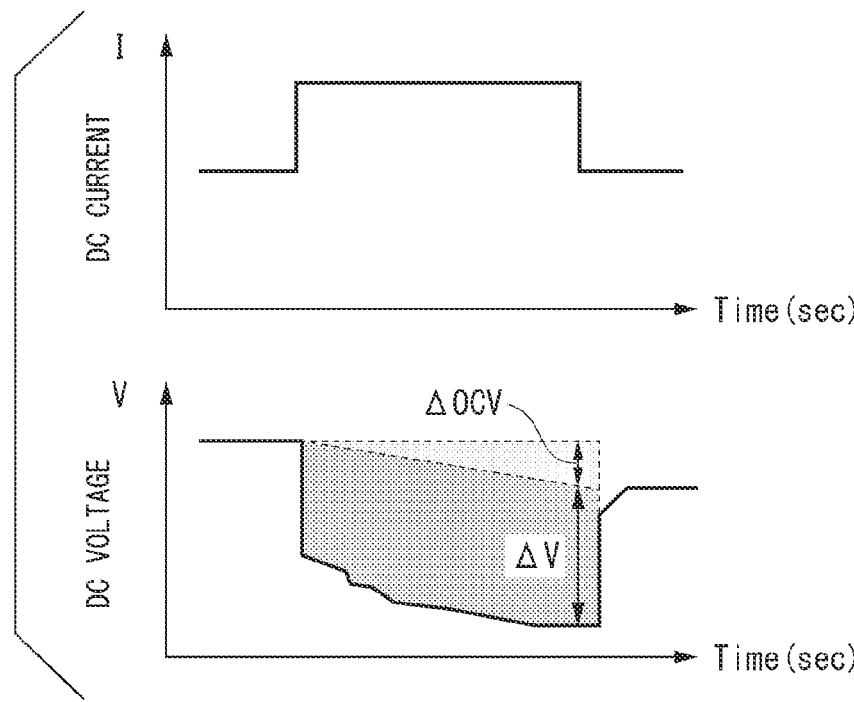
FIG. 7 is a diagram which shows an example of a relationship between a DC current and a DC voltage of a secondary battery in chronological order.

FIG. 7 is a diagram which shows an example of a relationship of a DC current "I" and a DC voltage "V" of the secondary battery in chronological order. A graph on the upper side in FIG. 7 represents changes in pulse current due to a pulse current applied to the equivalent circuit in chronological order. A graph on the lower side in FIG. 7 represents changes in DC voltage of the equivalent circuit in chronological order. In other words, the graph on the lower side in FIG. 7 represents changes in DC resistance (=V/I) of the equivalent circuit in chronological order.

The resistance calculation unit 14 adds an amount of change "ΔV" in the DC voltage of the equivalent circuit to which a pulse current is applied and the amount of change "ΔOCV" in the open circuit voltage of the equivalent circuit. The resistance calculation unit 14 divides a result of the addition by a current value when the pulse current is applied to the equivalent circuit to calculate the DC resistance (direct current internal resistance) of the equivalent circuit. The DC resistance calculated in this manner is used for extrapolation prediction of an output of the deteriorated secondary battery. As a result, it is possible to improve an accuracy in calculation of the DC resistance of the deteriorated secondary battery.

[Operation Example of Resistance Calculation Device]

FIG. 8 is a flowchart which shows an operation example of the resistance calculation device.

The acquisition unit 11 acquires an opening end potential curve for each single electrode before the deterioration of the deteriorated secondary battery by the differential analysis (the dV/dQ analysis) of a voltage and a capacity and the charging and discharging curve fitting (step S101). Next, the characteristic calculation unit 12 calculates a shrinkage rate for each single electrode based on the capacity shift amount of the positive electrode of the deteriorated secondary battery, the capacity shift amount of the negative electrode of the deteriorated secondary battery, the deterioration amount of the positive electrode, and the deterioration amount of the negative electrode (step S102). Next, the characteristic calculation unit 12 calculates a curve representing the characteristics of the state of charge and the open circuit voltage of the equivalent circuit of the deteriorated secondary battery by deforming the opening end potential curve for each single electrode before the deterioration of the deteriorated secondary battery by the shrinkage rate for each single electrode based on a fixed point (step S103).

Next, the change amount calculation unit 13 calculates the amount of change in the open circuit voltage of the equivalent circuit to which a pulse current is applied on the basis of a difference between the opening end potential curve for each single electrode before deterioration and the curve representing the characteristics of the state of charge and open circuit voltage of the equivalent circuit (step S104). Then, the resistance calculation unit 14 calculates the DC resistance of the equivalent circuit by dividing a result of adding the amount of change in the DC voltage of the equivalent circuit to which a pulse current is applied and the amount of change in the open circuit voltage of the equivalent circuit by a current value when the pulse current is applied to the equivalent circuit (step S105).

As described above, the DC resistance in consideration of the amount of change "ΔOCV" in the open circuit voltage of the equivalent circuit is used for extrapolation prediction of the DC resistance of the secondary battery. This can improve the accuracy in calculation of the DC resistance of the deteriorated secondary battery. In addition, the DC resistance in consideration of electrochemically equivalent circuits (RL-RC-CPE) determined on the basis of results of impedance measurement and the like is used for the extrapolation prediction of the DC resistance of the secondary battery. This can improve the accuracy in calculation of the DC resistance of the deteriorated secondary battery.

The embodiment described above can be expressed as follows.

The resistance calculation device includes a storage device that has stored a program, and a hardware processor, and the hardware processor executes the program, thereby acquiring an opening end potential curve for each single electrode before deterioration of a deteriorated secondary battery by a differential analysis of a voltage and a capacity and charging and discharging curve fitting, calculating a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and calculating a curve representing characteristics of a state of charge and an open circuit voltage of an equivalent circuit of the deteriorated secondary battery by deforming an opening end potential curve for each single electrode before deterioration of the deteriorated secondary battery by the shrinkage rate for each single electrode based on a fixed point, calculating an amount of change in open circuit voltage of an equivalent circuit to which a pulse current is applied on the basis of a difference between the opening end potential curve for each single electrode before the deterioration and the curve representing the characteristics of the state of charge and the open circuit voltage of the equivalent circuit, and calculating a DC resistance of the equivalent circuit by dividing a result of addition of an amount of change in a DC voltage of the equivalent circuit to which a pulse current is applied and the amount of change in the open circuit voltage of the equivalent circuit by a current value when the pulse current is applied to the equivalent circuit.

Modified Example

The potential curve for each single electrode before deterioration may be determined on the basis of an output of a secondary battery to be predicted without disassembling the secondary battery to be predicted.

Hereinafter, an embodiment of a battery state measurement technology of the present invention will be described with reference to FIGS. 9 to 13. In the following description, an example in which the battery state measurement technology of the present invention is adopted in an electric vehicle (EV) (hereinafter, it may be simply referred to as "vehicle") will be described. The battery state measurement technology of the present invention is not limited to batteries installed in vehicles, but can also be applied to batteries other than in-vehicle batteries.

A configuration of a vehicle in which the battery state measuring system is adopted and a battery state measurement method, which will be described below, are merely examples of embodiments of the battery state measurement technology of the present invention, and the present invention is not limited thereto.

[Configuration of Vehicle in which Battery State Measuring System is Adopted]

A battery state measurement technology of the present invention can be used, for example, as the battery state measuring system.

Figure 9:
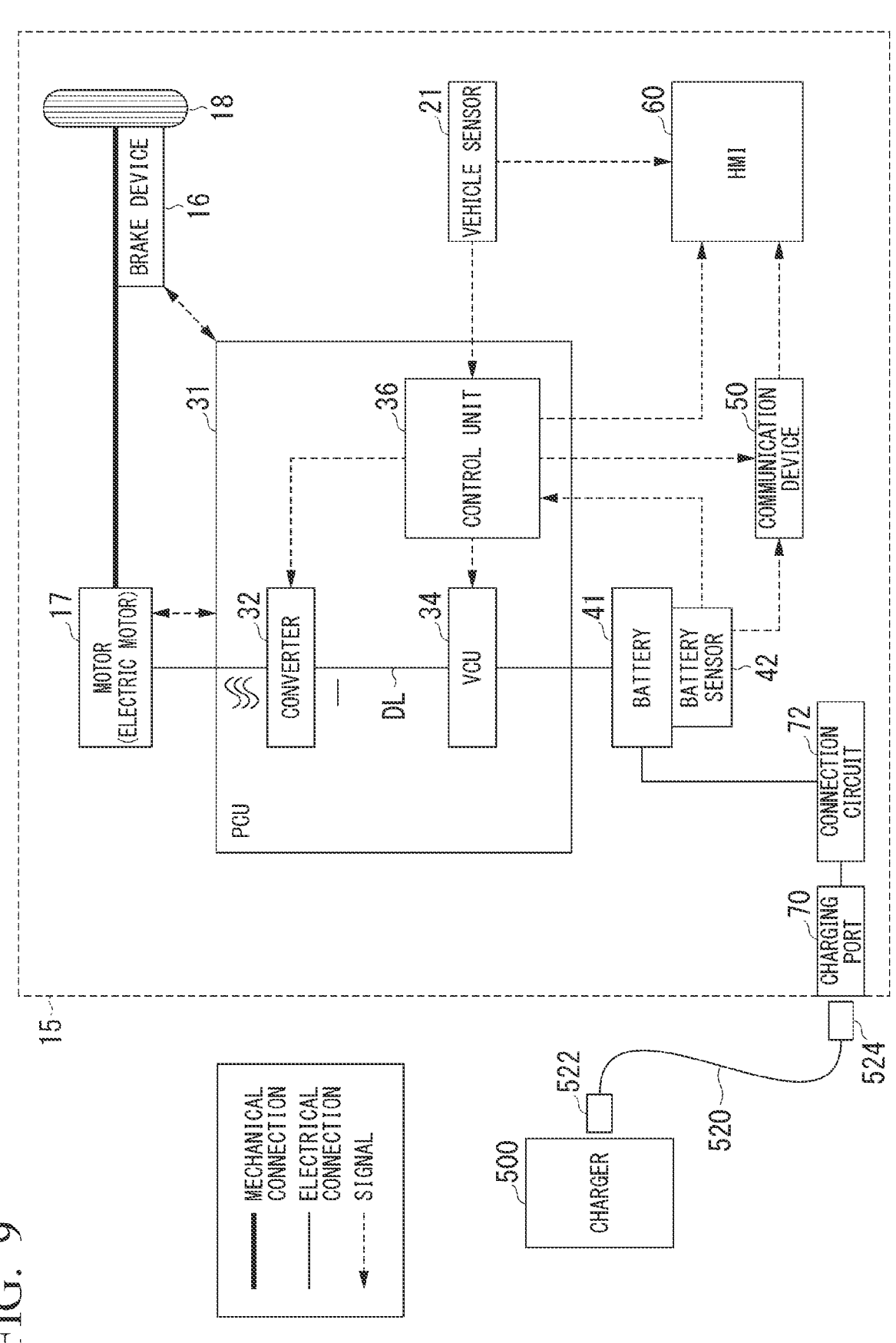
FIG. 9 is a diagram which shows an example of a configuration of a vehicle in which a battery state measuring system according to the embodiment is adopted.

FIG. 9 is a diagram which shows an example of a configuration of a vehicle 15 in which the battery state measuring system 2 according to the embodiment is adopted. The vehicle 15 shown in FIG. 9 is a battery electric vehicle (BEV) that travels by an electric motor driven by electric power supplied from a battery for traveling (a lithium-ion battery). Examples of the vehicle 15 include, for example, not only a four-wheeled vehicle, but also a saddle-type two-wheeled vehicle or a three-wheeled vehicle (including a vehicle with two front wheels and one rear wheel in addition to a vehicle with one front wheel and two rear wheels), and furthermore, all vehicles that travel by an electric motor driven by an operation of an internal combustion engine or electric power supplied from a battery, such as assisted bicycles.

The vehicle 15 shown in FIG. 9 includes, for example, a motor 17, a driving wheel 18, a brake device 16, a vehicle sensor 21, a power control unit (PCU) 30, a battery 41, a battery sensor (an acquisition unit) 42 such as a voltage sensor, a current sensor, and a temperature sensor, a communication device (a transmitting unit) 50, a human machine interface (HMI) 60 including a display device, a charging port 70, and a connection circuit 72.

The motor 17 is, for example, a three-phase AC motor. A rotor of the motor 17 is connected to the driving wheel 18. The motor 17 is driven by electric power supplied from a power storage unit (not shown) provided in the battery 41 and transmits rotational power to the driving wheels 18. In addition, the motor 17 generates power using a motion energy of the vehicle 15 when the vehicle 15 decelerates.

The brake device 16 includes, for example, a brake caliper, a cylinder that transmits a hydraulic pressure to the brake caliper, and an electric motor that generates a hydraulic pressure in the cylinder. The brake device 16 may also include, as a backup mechanism, a mechanism that transmits a hydraulic pressure generated by an operation of a user (a driver) of the vehicle 15 with respect to a brake pedal (not shown) to the cylinder via a master cylinder. The brake device 16 is not limited to a constituent described above, and may be, for example, an electronically controlled hydraulic brake device that transmits a hydraulic pressure of the master cylinder to the cylinder.

The vehicle sensor 21 includes, for example, an accelerator opening sensor, a vehicle speed sensor, and a brake stepping amount sensor. The accelerator opening sensor is attached to an accelerator pedal. The accelerator opening sensor detects an amount of operation of the accelerator pedal by the driver, and outputs the detected amount of operation as an accelerator opening to a control unit (an observation unit) 36 provided in the PCU 31, which will be described below. The vehicle speed sensor includes, for example, a wheel speed sensor and a speed calculator attached to each wheel of the vehicle 15, derives a speed (a vehicle speed) of the vehicle 15 by collecting wheel speeds detected by the wheel speed sensor, and outputs it to a control unit 36 and the HMI 60. The brake stepping amount sensor is attached to the brake pedal. The brake stepping amount sensor detects the amount of operation of the brake pedal by the driver, and outputs the detected amount of operation to the control unit 36 as a brake stepping amount.

The PCU 31 includes, for example, a converter 32, a voltage control unit (VCU) 34, and the control unit 36. In FIG. 9, these components are shown as a single configuration as the PCU 31, but the shown example is only an example, and these components in the vehicle 15 may be disposed in a distributed manner.

The converter 32 is, for example, an AC-DC converter. A DC side terminal of the converter 32 is connected to a DC link DL. The battery 41 is connected to the DC link DL via the VCU 34. The converter 32 converts an alternating current generated by the motor 17 into a direct current and outputs it to the DC link DL.

The VCU 34 is, for example, a DC-DC converter. The VCU 34 boosts the power supplied from the battery 41 and outputs it to the DC link DL.

The control unit 36 includes, for example, a motor control unit, a brake control unit, and a battery and VCU control unit. The motor control unit, the brake control unit, and the battery and VCU control unit may be replaced with separate control devices, for example, control devices such as a motor electronic control unit (ECU), a brake ECU, and a battery ECU.

In addition, the control unit 36, and the motor control unit, the brake control unit, and the battery and VCU control unit provided in the control unit 36 are realized, respectively, by, for example, each a hardware processor such as a central processing unit (CPU) executing a program (software). In addition, some or all of these components may be realized by hardware (a circuit unit; including circuitry) such as large scale integration (LSI), an application specific integrated circuit (ASIC), a field-programmable gate array (FPGA), or a graphics processing unit (GPU), and may also be realized by software and hardware in cooperation. In addition, some or all of functions of these components may be realized by dedicated LSI. The program may be stored in advance in a storage device (a non-transitory storage medium) such as a hard disk drive (HDD) or a flash memory provided in the vehicle 15. Alternatively, the program may be stored in a detachable storage medium (a non-transitory storage medium) such as a DVD or CD-ROM, and may be installed in the HDD or flash memory provided in the vehicle 15 by this storage medium being attached to a drive device provided in the vehicle 15.

The control unit 36, in the motor control unit, controls driving of the motor 17 on the basis of an output from the accelerator opening sensor provided in the vehicle sensor 21. In addition, the control unit 36, in the brake control unit, controls the brake device 16 on the basis of an output from the brake stepping amount sensor provided in the vehicle sensor 21. Moreover, the control unit 36, in the battery and VCU control unit, calculates, for example, a state of charge (SOC; hereinafter, referred to as a "battery charging rate") of the battery 41 on the basis of an output from the battery sensor 42 to be described below, which is connected to the battery 41 and outputs it to the VCU 34 and the HMI 60. Furthermore, the control unit 36 may also output information on a vehicle speed output by the vehicle sensor 21 to the HMI 60. The VCU 34 increases a voltage of the DC link DL according to an instruction from the battery and VCU control unit.

The battery 41 is a secondary battery which can be repeatedly charged and discharged, such as a lithium-ion battery. As a secondary battery constituting the battery 41, for example, in addition to a lead-acid battery, a nickel-hydrogen battery, a sodium-ion battery, and the like, a capacitor such as an electric double-layer capacitor, or a composite battery combining a secondary battery and a capacitor may be considered. In addition, in the embodiment of the present invention, a configuration of the secondary battery in the battery 41 is not particularly defined. In addition, the battery 41 may be, for example, a cassette-type battery pack that is detachably attached to the vehicle 15. The battery 41 stores electric power introduced from a charger 500 outside the vehicle 15 and discharges the electric power for traveling of the vehicle 15.

As described above, the battery state measuring system 2 according to the embodiment exhibits an effect of being able to analyze a deterioration state with high accuracy, especially when the deterioration state of a lithium-ion battery is analyzed.

The battery sensor 42 detects physical quantities of a current, a voltage, and a temperature of the battery 41.

The battery sensor 42 includes, for example, a current sensor, a voltage sensor, and a temperature sensor. The battery sensor 42 detects a current of a secondary battery (hereinafter simply referred to as the "battery 41") that constitutes the battery 41 with the current sensor, detects a voltage of the battery 41 with the voltage sensor, and detects a temperature of the battery 41 with the temperature sensor. The battery sensor 42 outputs data of the detected physical quantities of the current value, voltage value and temperature of the battery 41 (hereinafter referred to as "physical quantity data") to the control unit 36 and the communication device 50. The battery sensor 42 is an example of an "acquisition portion."

The control unit 36 observes the physical quantity data of the current value, voltage value and temperature of the battery 41 detected and output by the battery sensor 42, and calculates characteristics related to changes in a state of the battery 41, used to analyze (diagnose and determine) a deterioration state of the battery 41. For example, the control unit 36 observes the current value, the voltage value, and a capacity value (obtained from a positive electrode value and a negative electrode value) output by the battery sensor 42, and calculates a positive electrode single electrode data P and a negative electrode single electrode data N representing changes in the state of the battery 41. In addition, the control unit 36 may also calculate, for example, on the basis of the current value, voltage value, and capacity value observed at a predetermined observation time, the positive electrode single electrode data P and the negative electrode single electrode data N representing changes in the state of the battery 41 in relation to these values. A plurality of times (periods) are set as the predetermined observation time. This predetermined observation time can be set to, for example, a period of 5 seconds, 10 seconds, 15 seconds, or the like. Each period is set as a separate observation time depending on whether the battery 41 is in a charged state or in a discharged state. When a period during which the state of the battery 41 is continuously the same corresponds to any one of the "predetermined observation times," the physical quantity data observed during this period is adopted as observation data at the corresponding observation time.

For example, the physical quantity data observed during a period in which the battery 41 is continuously discharged for 5 seconds is adopted as the observation data for a discharge time of 5 seconds. In addition, for example, the physical quantity data observed during a period in which the battery 41 is continuously discharged for 10 seconds is adopted as the observation data for a discharge time of 10 seconds. When there are a plurality of corresponding predetermined observation times, the same physical quantity data may be redundantly adopted as observation data for different observation times. For example, in the physical quantity data observed during the period in which the battery 41 is continuously discharged for 10 seconds, the physical quantity data for continuous 5 seconds may be adopted as both the observation data for a discharge time of seconds and the observation data for a discharge time of 10 seconds.

The control unit 36 outputs data representing each of characteristics related to changes in the state of the battery 41 calculated on the basis of physical quantity data (observation data) observed at a predetermined observation time (hereinafter referred to as "characteristic data") to the communication device 50. The control unit 36 is an example of the "observation unit."

The communication device 50 includes a wireless module for connecting a cellular network and a Wi-Fi network.

The communication device 50 may include a wireless module for using Bluetooth (a registered trademark) or the like. The communication device 50 transmits or receives various types of information related to the vehicle 15 to or from, for example, the server device or the like to be described below, which is provided on a network (not shown) that manages the traveling of the vehicle 15 and the state of the battery 41 according to communication in a wireless module. The communication device 50 transmits each piece of characteristic data of the battery 41 output by the control unit 36 to the server device 200 to be described below. The communication device 50 may receive information representing the deterioration state of the battery 41 analyzed by the server device 200 to be described below and transmitted from the server device 200, and output the received information representing the deterioration state of the battery 41 to the HMI 60. The communication device 50 is an example of the "transmitting unit."

The HMI 60 presents various types of information to the user of the vehicle 15, such as the driver, and receives an input operation by the user. The HMI 60 is, for example, a so-called touch panel obtained by combining a display device such as a liquid crystal display (LCD) and an input device that detects an input operation. The HMI 60 may include various display units other than the display device, a speaker, a buzzer, a switch other than the input device, a key, and the like. The HMI 60 may share the display device or input device with, for example, a display device or input device such as an in-vehicle navigation device.

The charging port 70 is a mechanism for charging the battery 41 (a lithium-ion battery). The charging port 70 is provided toward the outside of a vehicle body of the vehicle 15. The charging port 70 is connected to the charger 500 via a charging cable 520. The charging cable 520 includes a first plug 522 and a second plug 524. The first plug 522 is connected to the charger 500. The second plug 524 is connected to the charging port 70. Electricity supplied from the charger 500 is input (supplied) to the charging port 70 via the charging cable 520.

Also, the charging cable 520 includes a signal cable attached to a power cable. A signal cable mediates communication between the vehicle 15 and the charger 500. Therefore, each of the first plug 522 and the second plug 524 is provided with a power connector for connecting the power cable and a signal connector for connecting the signal cable.

The connection circuit 72 is provided between the charging port 70 and the battery 41. The connection circuit 72 transmits a current introduced from the charger 500 via the charging port 70, for example, a direct current, as a current to be supplied to the battery 41. In addition, the connection circuit 72 outputs, for example, a direct current to the battery 41 to store (charge) electric power in the battery 41 (lithium-ion battery).

[Configuration of Battery State Measuring System]

Figure 10:
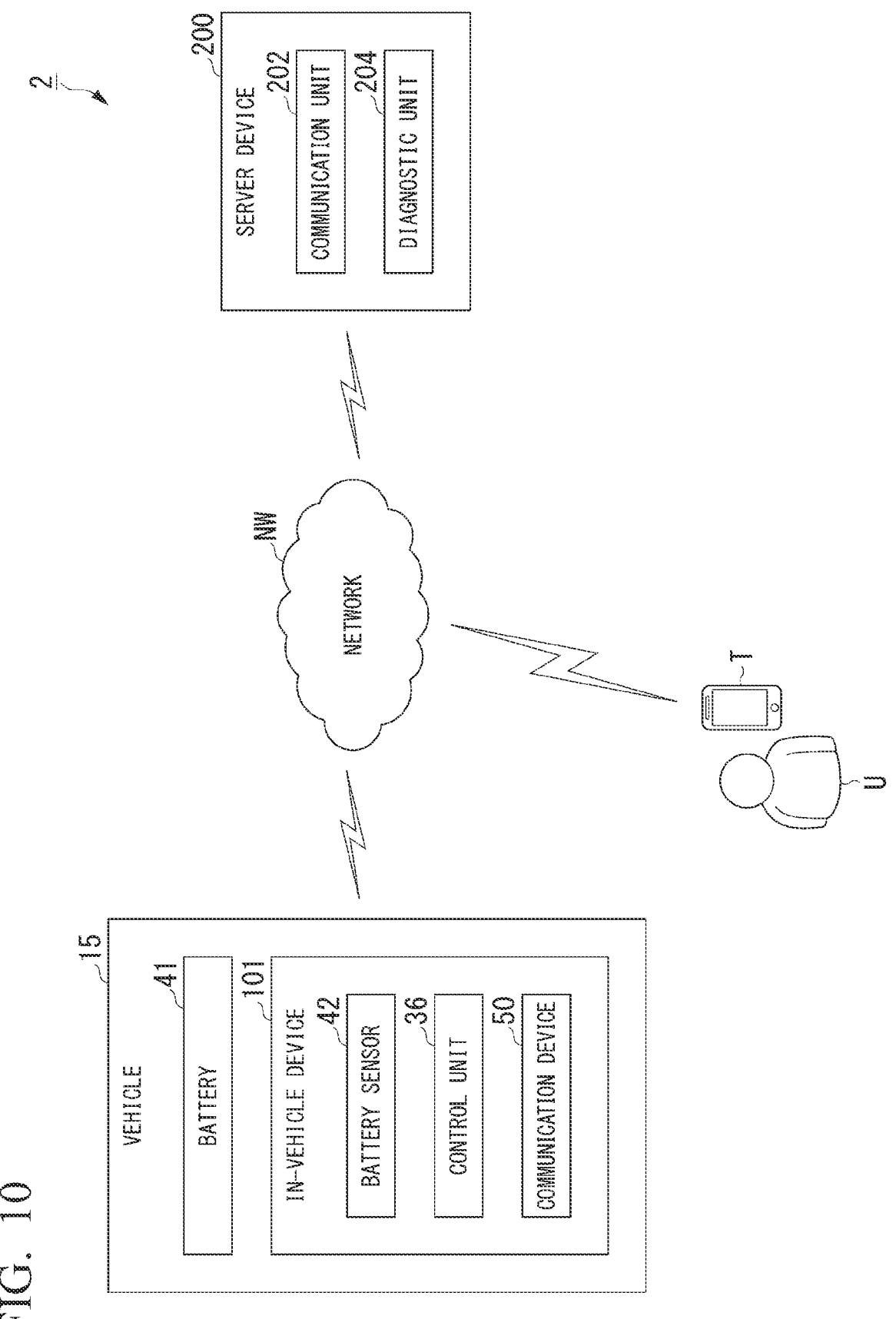
FIG. 10 is a diagram which shows an example of a configuration of the battery state measuring system according to the embodiment.

Next, an example of a battery state measuring system including a vehicle 15 in which the battery 41 is mounted will be described. FIG. 10 is a diagram which shows an example of a configuration of the battery state measuring system 2 according to the embodiment.

The battery state measuring system 2 shown in FIG. 10 is roughly configured to include, for example, an in-vehicle device 101 provided in the vehicle 15 in which the battery 41 is mounted, and a server device 200.

The communication device 50 and the server device 200 communicate with each other via a network NW.

The network NW is, for example, a wireless communication network including the Internet, a wide area network (WAN), a local area network (LAN), a provider device, a wireless base station, and the like. Note that FIG. 10 shows a state where a user terminal T is connected to the network NW. In this case, for example, the server device 200 can also communicate with the user terminal T via the network NW.

The battery state measuring system 2 is a system for analyzing and determining the deterioration state of the battery 41 provided in the vehicle 15. In the battery state measuring system 2, the in-vehicle device 101 provided in the vehicle 15 transmits each piece of characteristic data related to changes in the state of the battery 41 to the server device 200 via the network NW. Then, in the battery state measuring system 2, the server device 200 analyzes the deterioration state of the battery 41 provided in the vehicle 15 on the basis of each piece of characteristic data transmitted by the in-vehicle device 101. In the battery state measuring system 2, the server device 200 transmits information on a result of analyzing the deterioration state of the battery 41 (an analysis result) to the vehicle 15 via the network NW.

As a result, for example, the HMI 60 provided in vehicle 15 presents the information on an analysis result transmitted from the server device 200 to the user of the vehicle 15 by, for example, displaying it on a display device. Moreover, in the battery state measuring system 2, the server device 200 may transmit the information on an analysis result of the deterioration state of the battery 41 to the user terminal T via the network NW. As a result, the user terminal T can notify, for example, the user of the vehicle 15 of the information of the analysis result transmitted by the server device 200.

The battery state measuring system 2 may perform learning of the deterioration state of the battery 41 on the basis of a result of the server device 200 analyzing the deterioration state of the battery 41.

As a result, in the battery state measuring system 2, the server device 200 can more appropriately manage the deterioration state of the battery 41 provided in the vehicle 15.

The in-vehicle device 101 includes, for example, the battery sensor (the acquisition portion) 42 that acquires physical quantity data indicating the physical quantity related to the state of the battery 41 mounted in the vehicle 15, the control unit 36 (the observation unit) that observes characteristics related to changes in the state of the battery 41 on the basis of the physical quantity data, and the communication device (the transmitting unit) 50 that transmits a plurality of pieces of characteristic data representing the observed characteristics to the server device 200.

The battery sensor 42 detects the current value, voltage value, and temperature of the battery 41 at, for example, 10 millisecond intervals. The battery sensor 42 outputs the physical quantity data such as the current value, voltage value, and temperature of the detected battery 41 to the control unit 36.

The control unit 36 observes the physical quantity data such as the current value, voltage value, capacity value, and temperature of the battery 41 output by the battery sensor 42, and generates characteristic data representing the state of the battery 41 on the basis of the observed physical quantity data. Characteristic data is, for example, data representing $dV/dQ$ of the battery 41 used for analyzing the deterioration state of the battery 41. For example, the control unit 36 can be configured to generate characteristic data for each observation time when the discharge time is 5 seconds, 10 seconds, and 15 seconds, and characteristic data for each observation time when the charging time is 5 seconds, 10 seconds, and 15 seconds. In this case, the control unit 36 measures each period of observation time by, for example, a timer function, and generates each piece of characteristic data on the basis of the physical quantity data observed during the measured period of observation time. For example, when characteristic data representing $dV/dQ$ for an observation time of the discharge time of 5 seconds is generated, the control unit 36 measures 5 seconds for which the battery 41 is continuously discharged, and generates characteristic data representing $dV/dQ$ on the basis of each voltage value and a corresponding capacity value obtained by, for example, observing the physical quantity data of the battery 41 detected and output by the battery sensor 42 at intervals of 10 milliseconds during the measured period. Similarly, the control unit 36 generates characteristic data representing $dV/dQ$ for each observation time of the discharge time of 10 seconds and a discharge time of 15 seconds, and characteristic data for each observation time of a charging time of 5 seconds, a charging time of 10 seconds, and a charging time of 15 seconds.

The characteristic data representing $dV/dQ$ is not shown, but are obtained from a charge and discharge curve in which each capacity value obtained by observation is plotted on the horizontal axis and a capacity differential of a corresponding voltage value is plotted on the vertical axis. This $dV/dQ$ is data used for the analysis of the deterioration state of the battery 41. The control unit 36 may use the physical quantity data observed at a start of an observation time and the physical quantity data observed at an end of an observation time as characteristic data. That is, the control unit 36 may set a set of two current values, two voltage values, and two capacity values (four pieces of physical quantity data) at the start and end of the observation time as one piece of characteristic data representing $dV/dQ$.

The control unit 36 outputs the characteristic data generated as described above, including information on the observation time and information on whether the battery 41 is in a charged state or a discharged state, to the communication device 50. The characteristic data may also include information indicating changes in the temperature of the battery 41 and information on an SOC (a battery charging rate) of the battery 41.

The communication device 50 transmits the characteristic data of the battery 41 for each observation time output by the control unit 36 to the server device 200 by communication via the network NW.

The user terminal T is, for example, a terminal device such as a smartphone or a tablet terminal owned by a user of the user terminal T (hereinafter sometimes referred to as a "user U") such as a driver of the vehicle 15. The user terminal T may be, for example a stationary terminal device used by the user U. At the user terminal T, an application (hereinafter referred to as a "battery checking application") for checking and receiving notification of the deterioration state of the battery 41 is executed. When the user terminal T receives the information on an analysis result transmitted from the server device 200, the user terminal T presents the received information on an analysis result to the user U by, for example, displaying it on a display device. The user U can request the server device 200 to check a current deterioration state of the battery 41 at any timing by operating the battery checking application being executed by the user terminal T. In this case, the user terminal T transmits a checking request requesting transmission of the deterioration state of the battery 41 to the server device 200 via the network NW.

The server device 200 manages the deterioration state of the battery 41 that is provided in the vehicle 15. The server device 200 includes, for example, a communication unit (a receiving unit) 202 and a diagnostic unit (an analyzing unit) 204. The communication unit 202 and the diagnostic unit 204 are realized, respectively, by, for example, a hardware processor such as a CPU executing a program (software). In addition, some or all of these components may be realized by hardware (a circuit unit; including circuitry) such as LSI, an ASIC, an FPGA, or a GPU, and may also be realized by software and hardware in cooperation. In addition, some or all of functions of these components may be realized by dedicated LSI. The program may be stored in advance in a storage device (a storage device including a non-transitory storage medium) such as an HDD or a flash memory provided in the server device 200. Alternatively, the program may be stored in a detachable storage medium (a non-transitory storage medium) such as a DVD or CD-ROM, and may be installed in the HDD or flash memory provided in the server device 200 by this storage medium being attached to a drive device provided in the server device 200.

The communication unit 202 exchanges information by communicating with the communication device 50 provided in the vehicle 15 and the user terminal T via the network NW. The communication unit 202 receives each piece of the characteristic data of the battery 41 transmitted by the in-vehicle device 101 provided in the vehicle 15 by communication via the network NW. The communication unit 202 outputs the each received piece of the characteristic data of the battery 41 to the diagnostic unit 204. When the communication unit 202 receives the checking request of the battery 41 transmitted by the user terminal T by communication via the network NW, it outputs the received checking request of the battery 41 to the diagnostic unit 204. The communication unit 202 is an example of the "receiving unit."

The diagnostic unit 204 analyzes the deterioration state of the battery 41 on the basis of each piece of the characteristic data of the battery 41 output from the communication unit 202. More specifically, the diagnostic unit 204 collects each piece of the characteristic data of the battery 41 output by the communication unit 202 separately for each observation time included in the characteristic data. Then, the diagnostic unit 204 analyzes the deterioration state of the battery 41 based on a characteristic data group including a plurality of pieces of collected characteristic data for a predetermined observation time. When the characteristic data representing dV/dQ is transmitted by the in-vehicle device 101, the diagnostic unit 204 dV/dQ analyzes the deterioration state of the battery 41 based on, for example, the characteristic data group including the plurality of pieces of characteristic data representing dV/dQ for a predetermined observation time. The predetermined observation time that the diagnostic unit 204 uses as a reference when analyzing the deterioration state of the battery 41 is, for example, the characteristic data group when the observation time is the shortest 5 seconds, which can be collected with the highest frequency. The diagnostic unit 204 uses characteristic data groups for observation times other than the reference observation time as assistance when analyzing the deterioration state of the battery 41. For example, when the characteristic data group when the observation time is 5 seconds is used as the reference, the diagnostic unit 204 uses a characteristic data group when the observation time is 10 seconds or 15 seconds to correct an analysis result obtained by analyzing the deterioration state of battery 41.

Here, an example of the analysis of the deterioration state of the battery 41 in the diagnostic unit 204 will be described.

Figure 11:
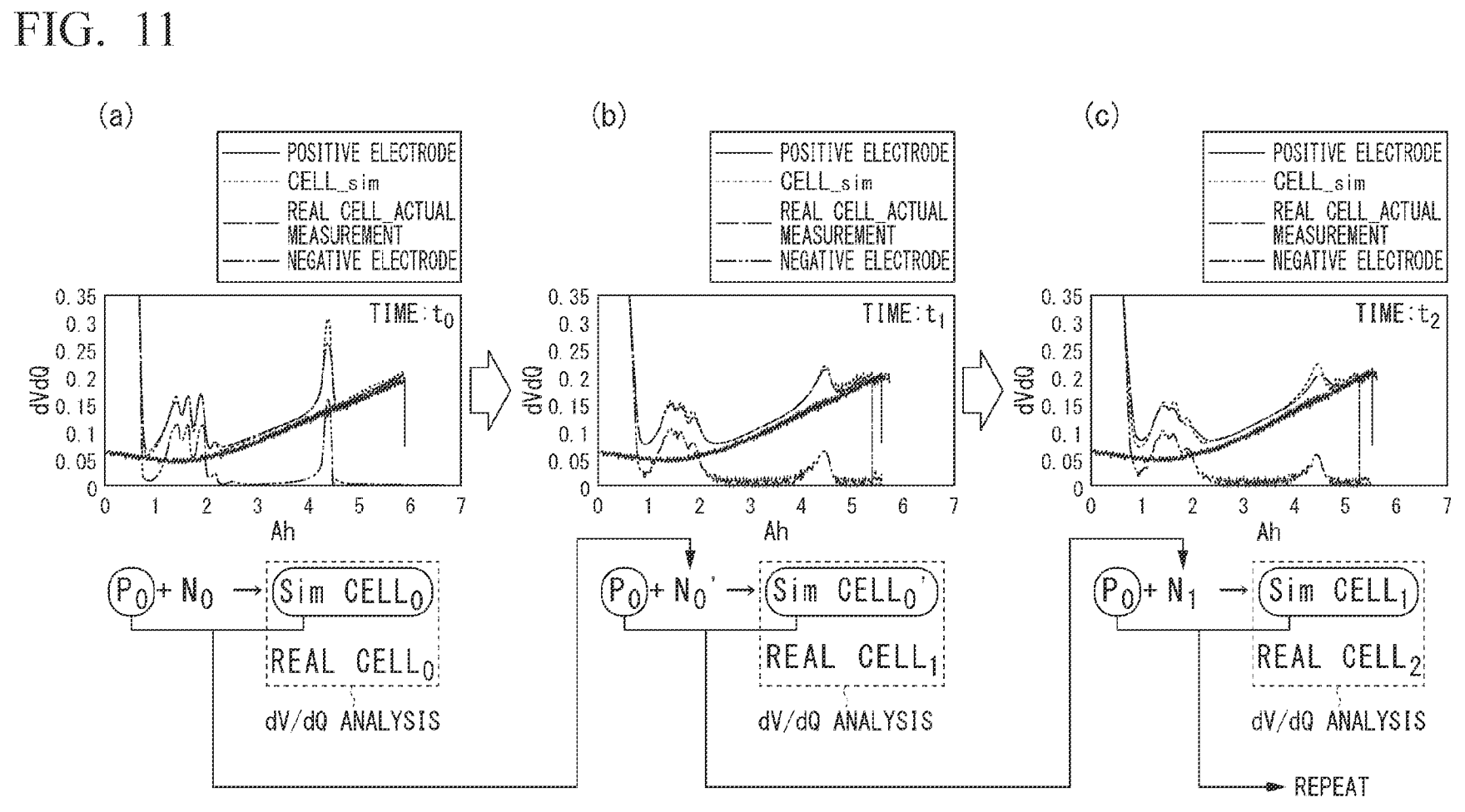

FIG. 11 is a diagram which describes an example of processing of analyzing the deterioration state of the battery 41 in the server device 200 (more specifically, the diagnostic unit 204), and is a graph describing an example of the analysis processing when a peak of a dV/dQ curve collapses at the time of analyzing the battery state using the dV/dQ curve. FIG. 11(a) shows the dV/dQ curve when the discharge time transmitted from the in-vehicle device 101 is to, FIG. 11(b) shows the dV/dQ curve when the discharge time is $t_1$, and FIG. 11(c) shows the dV/dQ curves when the discharge time is $t_2$, respectively. In these FIGS. 11(a) to 11(c), the horizontal axis is a capacity value (Ah) and the vertical axis is a dV/dQ.

As described above, the diagnostic unit 204 collects the characteristic data representing the dV/dQ of the battery 41, transmitted by the in-vehicle device 101 and output from the communication unit 202, separately for each observation time. In FIGS. 11(a) to 11(c), the diagnostic unit 204 collects characteristic data representing dV/dQ when the discharge time is $t_0$, characteristic data representing a dV/dQ curve when the discharge time is $t_1$, and characteristic data representing dV/dQ when the discharge time is $t_2$ separately as respective characteristic data groups.

Based on the characteristic data described above, the diagnostic unit 204 analyzes the deterioration state of the battery 41 using an analysis of a dV/dQ curve that indicates an amount of change in voltage with respect to a change in a reference capacity of the battery 41.

As will be described in detail below, the diagnostic unit 204 repeatedly executes processing of obtaining a negative electrode value based on an initial positive electrode value in the dV/dQ curve and a cell value one cycle before, and calculating a cell value on the basis of the initial positive electrode value and the negative electrode value.

Here, graphs of FIGS. 11(a) to 11(c) described above show dV/dQ curves obtained by dismantling the battery 41 at an initial stage and fitting an initial positive electrode single electrode data (an initial positive electrode value) $P_0$ and an initial negative electrode single electrode data $N_0$ acquired in a coin cell state in advance with respect to measured values of the positive electrode single electrode data P and the negative electrode single electrode data N in the battery 41 used for the times described above, respectively. FIG. 11(a) is the dV/dQ curve (a real $cell_0$) for time $t_0$ when a real cell is used, FIG. 11(b) is the dV/dQ curve (a real $cell_1$) for time $t_1$, and FIG. 11(c) is the dV/dQ curve (a real $cell_2$) for time $t_2$.

First, the battery 41 is dismantled in the initial stage in advance, and the initial positive electrode single electrode data $P_0$ and the initial negative electrode single electrode data $N_0$ are acquired in the coin cell state to obtain an Ah-OCP (Open Circuit Potential) curve. In addition, for each Ah-OCP curve obtained by observation, a dV/dQ curve with a capacity value plotted on the horizontal axis and a capacity differential of a corresponding voltage value plotted on the vertical axis is obtained. Then, an Ah-OCP curve, that is, the capacity, of a single electrode Sim $cell_0$ can be obtained based on the single electrode positive electrode and negative electrode Ah-OCP curves described above.

Next, as shown in FIG. 11(a), using the initial positive electrode single electrode data $P_0$ and the initial negative electrode single electrode data $N_0$, the positive electrode single electrode data P and the negative electrode single electrode data N of real cell scale are generated, and a dV/dQ curve of Sim $cell_0$ is generated by fitting feature amounts derived from a positive electrode and a negative electrode of the dV/dQ curve of the real $cell_0$. Then, using the initial positive electrode single electrode data $P_0$ and the Sim $cell_0$ optimized by the dV/dQ analysis, virtual negative electrode single electrode data $N_0'$ is generated.

A dV/dQ relationship between a cell and each piece of single electrode data at this time is represented by the following equation (2).

$$[dSim V_{cell}/dQ]-[dV_{positive\ electrode}/dQ]=[dV_{negative\ electrode}/dQ] \quad (2)$$

Then, as shown in FIG. 11(b), using the initial positive electrode single electrode data $P_0$ and the virtual negative electrode single electrode data $N_0'$, a dV/dQ curve is generated by fitting feature amounts derived from a positive electrode and a negative electrode of the real $cell_1$ for the time $t_1$ (for example, two weeks later) when the battery 41 is used. At this time, by subtracting the dV/dQ curve of the positive electrode single electrode data P optimized by the dV/dQ analysis from the dV/dQ curve of the real cells, a dV/dQ curve of a deteriorated negative electrode single electrode data (a negative electrode value) $N_1$ is generated. The dV/dQ relationship between a cell and each piece of single electrode data at this time is also represented by the equation (2) described above.

Then, as shown in FIG. 11(c), using the initial positive electrode single electrode data $P_0$ and the deteriorated negative electrode single electrode data $N_1$ described above, a dV/dQ curve is generated by fitting feature amounts derived from a positive electrode and a negative electrode of the real $cell_2$ for time $t_2$ when the battery 41 is used (for example, 4 weeks later).

In the battery state measuring system 2 according to the embodiment, by repeating the processing shown in FIGS. 11(a) to 11(c), fitting of the dV/dQ curve of an $n_{th}$ negative electrode single electrode data N is performed by using the dV/dQ curve using an updated $(n-1)_{th}$ negative electrode single electrode data $N_{n-1}$.

As shown in FIGS. 11(a) to 11(c), if real cell deterioration progresses as time elapses with the real $cell_0$, real $cell_1$, and real $cell_2$, the peak of a curve of "real cell_actual measurement" shown in FIGS. 11(a) to 11(c) gradually collapses. On the other hand, in the battery state measuring system 2 according to the embodiment, since the negative electrode single electrode data $N_{n-1}$ is updated, Sim $cell_x$ data generated using the updated negative electrode single electrode data $N_{n-1}$ can also reproduce the collapse of the peak of the dV/dQ curve, like the real $cell_x$, it is possible to improve a fitting accuracy. As a result, even when the deterioration of the battery 41 consisting of a lithium-ion battery is analyzed using the dV/dQ curve, since a relative positional relationship between a capacity deterioration amount of the positive electrode and the negative electrode and a potential of the positive and negative electrodes can be evaluated with high accuracy, it is possible to increase a Sim accuracy of a cell capacity obtained using a capacity value (Ah)-OCP curve of the positive electrode and the negative electrode.

Figure 12:
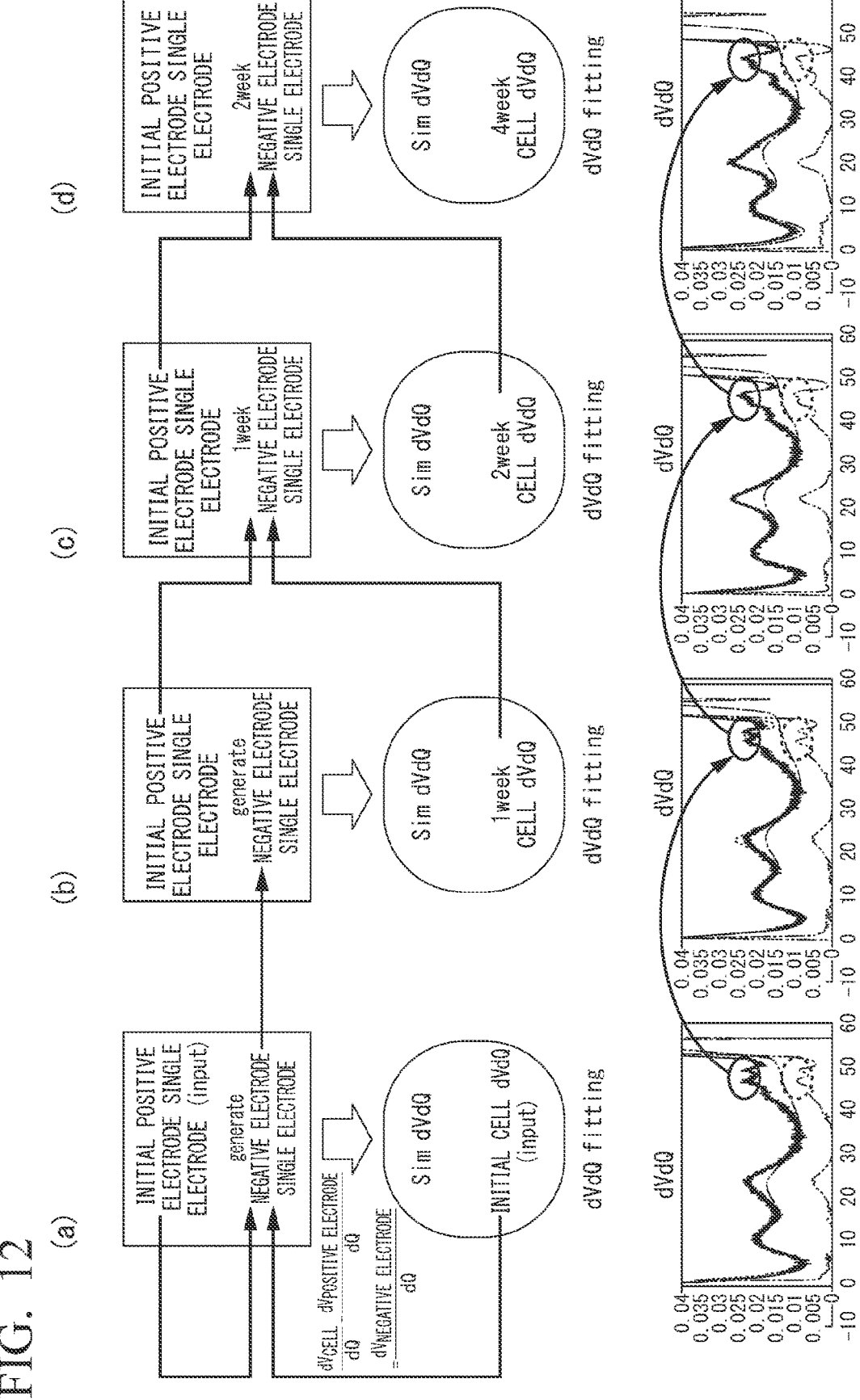
FIG. 12 is a diagram which describes an example of processing of analyzing deterioration of a battery at an initial stage, 1 week, 2 weeks, and 4 weeks after generating a dV/dQ curve and analyzing the battery state using the battery state measuring system according to the embodiment.

In the following description, a procedure for updating the dV/dQ curve of the negative electrode single electrode data N will be described with reference to FIGS. 12(a) to 12(d). FIG. 12 is a graph which describes an example of processing of analyzing the deterioration of the battery 41 at an initial stage (FIG. 12(a)), one week later (FIG. 12(b)), two weeks later (FIG. 12(c)), and four weeks later (FIG. 12(d)) using the dV/dQ curve.

Even in the procedure shown in FIGS. 12(a) to 12(c), as described with reference to FIGS. 11(a) to 11(c) above, the collapse of the peak of the dV/dQ curve can be reproduced by updating the negative electrode single electrode data $N_{n-1}$ as time elapses with the initial stage, one week later, two weeks later, and four weeks later, and thus it possible to significantly improve the fitting accuracy.

Returning to FIG. 10, the diagnostic unit 204 outputs information on an analysis result representing the analyzed deterioration state of the battery 41 to the communication unit 202. Note that, when the communication unit 202 outputs a checking request from the user terminal T, the diagnostic unit 204 outputs information on an analysis result representing the current deterioration state of the battery 41 analyzed using the characteristic data collected so far to the communication unit 202.

The communication unit 202 transmits the information on an analysis result output by the diagnostic unit 204 to the in-vehicle device 101 and the user terminal T provided in the vehicle 15 by communication via the network NW. As a result, the analysis result of the deterioration state of the battery 41 analyzed by the diagnostic unit 204 is displayed on, for example, a display device by the HMI 60 provided in the vehicle 15. In addition, the analysis result of the deterioration state of the battery 41 analyzed by the diagnostic unit 204 may be displayed on a display device of the user terminal T and presented to the user U by the battery checking application.

[Overall Flow of Processing of Battery State Measuring System]

Figure 13:
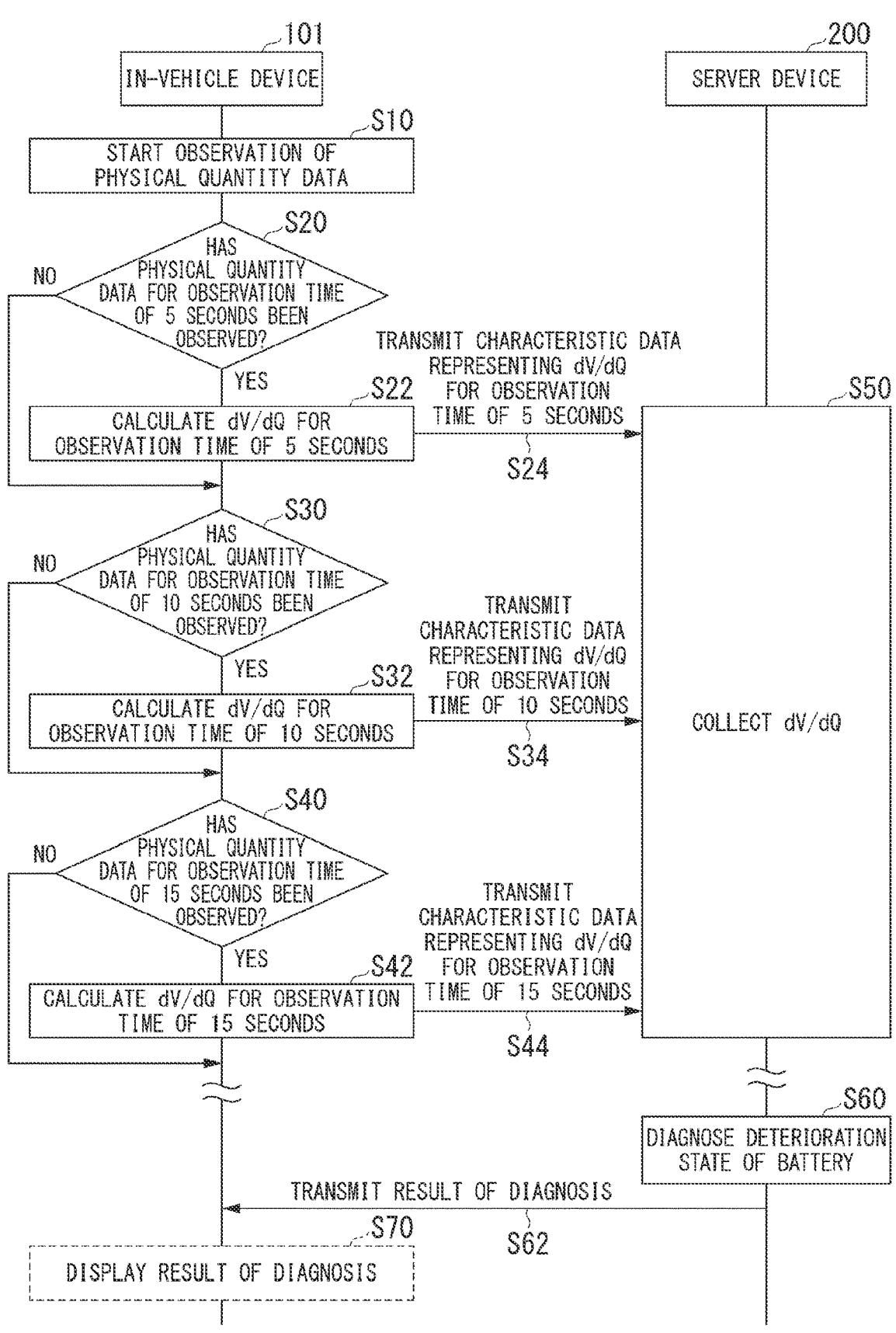
FIG. 13 is a sequence diagram which shows an example of an overall flow of processing in the battery state measuring system.

Next, an example of an overall flow of processing for analyzing (diagnosing and determining) the deterioration state of the battery 41 in the battery state measuring system 2 will be described. FIG. 13 is a sequence diagram which shows an example of the overall flow of processing in the battery state measuring system 2. FIG. 13 shows an example of processing between the in-vehicle device 101 and the server device 200 that cooperate when the deterioration state of the battery 41 in the battery state measuring system 2 is analyzed. The processing of this sequence diagram is repeatedly executed while the battery 41 is being used in the vehicle 15. Note that the in-vehicle device 101 and the server device 200 perform operations corresponding to the components shown in FIG. 10, respectively, but it is assumed that the in-vehicle device 101 and the server device 200 directly exchange information for analyzing the deterioration state of the battery 41 and information on an analysis result for ease of description in the following description. In addition, in the following description, it is assumed that the deterioration state of the battery 41 is analyzed on the basis of the dV/dQ curve obtained from a plurality of pieces of characteristic data. The observation of the physical quantity data of the battery 41 in the in-vehicle device 101 is performed regardless of whether the battery 41 is in a charged state or a discharged state, but it is assumed that the observation of the physical quantity data is started when the battery 41 is in a discharged state for ease of description in the following description.

In one example of processing in the battery state measuring system 2 shown in FIG. 13, first, when the battery 41 starts to be used in the vehicle 15 and is in a discharged state, the in-vehicle device 101 starts the observation of the physical quantity data of the battery 41 (step S10).

After that, the in-vehicle device 101 checks whether the physical quantity data for an observation time (a discharge time) of 5 seconds has been observed (step S20). That is, the in-vehicle device 101 checks whether it is possible to check the physical quantity data in a state where the battery 41 is continuously discharged during the discharge time of 5 seconds. When it is checked in step S20 that the physical quantity data for the discharge time of 5 seconds has been observed, the in-vehicle device 101 calculates dV/dQ for the observation time (the discharge time) of 5 seconds in the battery 41 on the basis of the observed physical quantity data (step S22). Then, the in-vehicle device 101 generates characteristic data representing the calculated dV/dQ for the observation time (the discharge time) of 5 seconds and transmits it to the server device 200 (step S24). As a result, the server device 200 collects the characteristic data transmitted by the in-vehicle device 101 as a characteristic data group for the discharge time of 5 seconds (step S50). Moreover, the in-vehicle device 101 advances the processing to step S30.

On the other hand, when it is checked in step S20 that the physical quantity data for a discharge time of 5 seconds has not been observed, the in-vehicle device 101 advances the processing to step S30. It is considered that the physical quantity data for a discharge time of 5 seconds has not been observed in step S20 when, for example, the battery 41 changes from a discharged state to a charged state for the discharge time of 5 seconds, and the like. In this case, the in-vehicle device 101 starts the observation of the physical quantity data for the observation time (a charging time) of 5 seconds in a state where the battery 41 is being charged.

Subsequently, the in-vehicle device 101 checks whether the physical quantity data for an observation time (a discharge time) of 10 seconds has been observed (step S30). In other words, the in-vehicle device 101 checks whether it is possible to observe the physical quantity data in a state where the battery 41 is continuously discharged for 5 seconds following the discharge time of 5 seconds, or for 10 seconds starting from a timing different from a start timing of the discharge time of 5 seconds. When it is checked in step S30 that the physical quantity data for the discharge time of 10 seconds has been observed, the in-vehicle device 101 calculates dV/dQ for the observation time (the discharge time) of 10 seconds in the battery 41 on the basis of the observed physical quantity data (step S32). Then, the in-vehicle device 101 generates characteristic data representing the calculated dV/dQ for the observation time (the discharge time) of 10 seconds and transmits it to the server device 200 (step S34). Accordingly, the server device 200 collects the characteristic data transmitted by the in-vehicle device 101 as a characteristic data group for the discharge time of 10 seconds in step S50. In addition, the in-vehicle device 101 advances the processing to step S40.

On the other hand, when it is checked in step S30 that the physical quantity data for the discharge time of 10 seconds has not been observed, the in-vehicle device 101 advances the processing to step S40. It is considered that the physical quantity data for the discharge time of 10 seconds has not been observed in step S30 when, for example, the battery 41 may change from a discharged state to a charged state for 5 seconds following the discharge time of 5 seconds or for the discharge time of 10 seconds, and the like. In this case, the in-vehicle device 101 starts the observation of the physical quantity data for the observation time (a charging time) of 10 seconds in a state where the battery 41 is being charged.

Subsequently, the in-vehicle device 101 checks whether the physical quantity data for an observation time (a discharge time) of 15 seconds has been observed (step S40). In other words, the in-vehicle device 101 checks whether it is possible to observe the physical quantity data in a state where the battery 41 is continuously discharged for 5 seconds following the discharge time of 10 seconds, or after checking in step S30, or for seconds starting from a timing different from the start timing of the discharge time of seconds or the discharge time of 10 seconds. When it is checked in step S40 that the physical quantity data for the discharge time of 15 seconds has been observed, the in-vehicle device 101 calculates dV/dQ for the observation time (the discharge time) of 15 seconds in the battery 41 on the basis of the observed physical quantity data (step S42). Then, the in-vehicle device 101 generates characteristic data representing the calculated dV/dQ for the observation time (the discharge time) of 15 seconds and transmits it to the server device 200 (step S44). Accordingly, the server device 200 collects the characteristic data transmitted by the in-vehicle device 101 as a characteristic data group for the discharge time of 15 seconds in step S50. In addition, the in-vehicle device 101 continues the observation of the physical quantity data in a next observation time (a discharge time).

On the other hand, when it is checked in step S40 that the physical quantity data for the discharge time of 15 seconds has not been observed, the in-vehicle device 101 continues the observation of the physical quantity data in a next observation time (a discharge time). It is considered that the physical quantity data for the discharge time of seconds has not been observed in step S40 when, for example, the battery 41 may change from a discharged state to a charged state for 5 seconds following the discharge time of 10 seconds or for the discharge time of 15 seconds, and the like. In this case, the in-vehicle device 101 starts the observation of the physical quantity data for the observation time (a charging time) of 15 seconds in a state where the battery 41 is being charged.

After that, the server device 200 analyzes the deterioration state of the battery 41 on the basis of a characteristic data group including the characteristic data for each observation time collected in step S50 (step S60). A timing at which the server device 200 starts to analyze the deterioration state of the battery 41 in step S60 is an arbitrary timing. For example, the server device 200 may collect the characteristic data for a reference observation time (for example, the characteristic data for the discharge time of 5 seconds) as much as necessary to analyze the deterioration state of the battery 41, and then analyze the deterioration state of the battery 41. In addition, for example, the server device 200 may collect characteristic data for an observation time (for example, the characteristic data for the discharge time of 10 seconds or 15 seconds) used for correcting an analysis result of the analyzed deterioration state of the battery 41 as much as necessary to correct the analysis result, and then start the analysis of the deterioration state of the battery 41. In addition, for example, the server device 200 may start the analysis of the deterioration state of the battery 41 when it receives a checking request for the battery 41 transmitted by the user terminal T.

Then, the server device 200 transmits the information on an analysis result of analyzing the deterioration state of the battery 41 to the in-vehicle device 101 (step S62). As a result, the in-vehicle device 101 outputs the information on an analysis result of analyzing the deterioration state of the battery 41 transmitted from the server device 200 to, for example, the HMI 60 provided in the vehicle 15, and causes the HMI 60 to display it on the display device, and to present it to the user of the vehicle 15 (step S70).

According to this overall processing flow, in the battery state measuring system 2, the in-vehicle device 101 and the server device 200 provided in the vehicle 15 in which the battery 41 is mounted cooperate with each other to analyze the deterioration state of the battery 41. At this time, in the battery state measuring system 2, the in-vehicle device 101 performs a certain degree of processing (processing for calculating dV/dQ for a predetermined observation time) related to the analysis of the deterioration state of the battery 41, and generates characteristic data representing dV/dQ used for the analysis of the deterioration state of the battery 41 to transmit it to the server device 200. As a result, in the battery state measuring system 2, the in-vehicle device 101 reduces a computational load thereon rather than analyzing the deterioration state of the battery 41 and the server device 200 analyzes the deterioration state of the battery 41 with higher accuracy, thereby managing the deterioration state of the battery 41 provided in the vehicle 15.

Moreover, in the battery state measuring system 2, since each piece of characteristic data of the battery 41, which is transmitted to the server device 200 by the in-vehicle device 101, is characteristic data generated in the in-vehicle device 101, for example, a data amount is reduced further than the physical quantity data detected by the battery sensor 42. For this reason, the battery state measuring system 2 can curb pressure on an information (data) communication band in a network NW between the in-vehicle device 101 and the server device 200.

In addition, the battery state measuring system 2 can transmit the analysis result of the deterioration state of the battery 41 analyzed by the server device 200 to the user terminal T. As a result, the user (user U) of the user terminal T, such as the driver of the vehicle 15, can check the current deterioration state of the battery 41 at an arbitrary timing even when he or she is not boarding in the vehicle 15.

A flow of processing between the server device 200 and the user terminal T consists of processing of transmitting a checking request from the user terminal T to the server device 200 in a state where the battery checking application is being executed, and processing of transmitting the analysis result of the deterioration state of the battery 41 from the server device 200 to the user terminal T, and can be easily understood. For this reason, a detailed description of the flow of processing between the server device 200 and the user terminal T will be omitted.

According to the battery state measuring system that performs processing according to the flow shown in the sequence diagram of FIG. 13, the in-vehicle device provided in the vehicle 15 observes the detected physical quantity of the battery at a plurality of different observation times, calculates characteristics related to a state change of the battery, and transmits the generated characteristic data to the server device. In the battery state measuring system of the embodiment, the server device collects the characteristic data representing the characteristics related to the state change of the battery transmitted by the in-vehicle device separately for each observation time, and analyzes the deterioration state of the battery on the basis of a group of the collected characteristic data representing the characteristics related to the state change of the battery. As a result, in the battery state measuring system of the embodiment, the server device can analyze the deterioration state of the battery with higher accuracy, and manage the deterioration state of the battery provided in the vehicle. Moreover, in the battery state measuring system of the embodiment, the in-vehicle device transmits characteristic data in a state in which processing for obtaining the characteristics related to the state change of the battery has been completed to some extent to the server device, and thus it is possible to analyze and manage the deterioration state of the battery in a state where the pressure on an information (data) communication band in the network NW between the in-vehicle device and the server device is curbed.

According to the battery state measuring system of the embodiment described above, the in-vehicle device 101 includes the battery sensor 42 that acquires physical quantity data indicating the physical quantity related to the state of the battery 41 mounted in the vehicle 15, the control unit 36 that observes characteristics related to changes in the state of the battery 41 on the basis of the physical quantity data, and the communication device 50 that transmits a plurality of pieces of characteristic data representing the observed characteristics to the server device 200, and the server device 200 includes the communication unit 202 that receives the plurality of pieces of characteristic data transmitted by the in-vehicle device 101, and the diagnostic unit 204 that analyzes the deterioration state of the battery 41 on the basis of the plurality of pieces of characteristic data. Then, in the battery state measuring system of the embodiment, the diagnostic unit 204 analyzes the deterioration state of the battery 41 using the analysis of the dV/dQ curve that indicates an amount of change in voltage with respect to changes in the reference capacity of the battery 41, and repeatedly executes processing of obtaining a negative electrode value on the basis of an initial positive electrode value in the dV/dQ curve and a cell value one cycle before and calculating a cell value on the basis of the initial positive electrode value and the negative electrode value. As a result, even if the peak of the dV/dQ curve collapses due to the deterioration of the battery 41, voltage fluctuation characteristics with respect to the reference capacity of the battery 41 can be accurately recognized, and therefore it is possible to detect and determine with high accuracy how much the battery 41 has deteriorated from the initial state by comparing a generated dV/dQ curve for determining the deterioration with the dV/dQ curve acquired in the initial state of the battery. Therefore, in the vehicle 15 in which the battery state measuring system is adopted, it is possible to manage the deterioration state of the battery 41 provided in the vehicle 15 with higher accuracy in the server device 200, and to improve convenience of using the vehicle 15 by, for example, notifying the user of the vehicle 15 in advance of a state in which a distance that the vehicle 15 can travel is significantly shortened, and the like.

The embodiment described above can be expressed as follows.

A battery state measuring system includes at least a server device that analyzes a state of a battery, in which the server device includes a hardware processor and a storage device that has stored a program, and the hardware processor reads and executes a program stored in the storage device, thereby receiving a plurality of pieces of characteristic data representing characteristics related to changes in a state of the battery on the basis of physical quantity data indicating physical quantities related to the state of the battery to analyze a deterioration state of the battery by an analysis of a dV/dQ curve that indicates an amount of change in voltage with respect to a change in a reference capacity of the battery, and repeatedly executing processing of obtaining a negative electrode value on the basis of an initial positive electrode value in the dV/dQ curve and a cell value one cycle before to calculate a cell value on the basis of the initial positive electrode value and the negative electrode value.

In the embodiment, a case where the vehicle 15 in which the battery state measuring system is adopted is a BEV has been described. However, as an electric vehicle, there is, for example, also a hybrid electric vehicle (HEV), that travels by electric power supplied in response to an operation of an internal combustion engine such as an engine operating on a fuel, or electric motor driven by electric power supplied from a battery (a lithium-ion battery) for traveling. For this reason, the battery state measuring system can also be adopted in such hybrid electric vehicles.

In this case, in hybrid electric vehicles, even a time when the internal combustion engine is operating to charge the battery can be the observation time of an object observing the physical quantity data to analyze the deterioration state of the battery.

Even in such a case, similarly to the above, the server device can analyze the deterioration state of the battery mounted in hybrid electric vehicles with higher accuracy. Note that the overall flow of processing in the battery state measuring system adopted in hybrid electric vehicles can be easily understood by considering it in the same manner as the overall flow of processing in the battery state measuring system adopted in BEV in the embodiment described above. For this reason, a detailed description of the overall processing flow in the battery state measuring system adopted in hybrid electric vehicles will be omitted.

There are also electric vehicles such as fuel cell vehicles (FCV) that travel using an electric motor driven by electric power supplied from a fuel cell. The battery state measuring system can also be adopted in the fuel cell vehicles. In this case, the battery described in the embodiment will be replaced with a fuel cell.

Even in this fuel cell, deterioration occurs in a process of use even with the cause different from that of a battery. For this reason, the battery state measuring system can also be adopted in such fuel cell vehicles. However, the physical quantity observed by the in-vehicle device and the processing of analyzing the deterioration state by the server device correspond to the fuel cell mounted in the fuel cell vehicles.

On the other hand, an overall flow of processing in a battery state measuring system adopted in a fuel cell vehicle can be easily understood by considering it in the same manner as the overall flow of processing for the battery state measuring system adopted in a BEV in the embodiment described above. For this reason, a detailed description of the overall flow of processing in the battery state measuring system adopted in fuel cell vehicles will be omitted.

As described above, although the embodiment of implementing the battery state measurement technology of the present invention in a vehicle has been described, the present invention can be implemented in a constituent other than a vehicle as long as it has a power supply (outlet), a charger, and a battery.

According to the battery state measurement method described above, the analysis of the deterioration state of a battery can be performed by the dV/dQ analysis in a server device without dismantling a used battery, and can be performed with high accuracy following changes in material characteristics due to deterioration even if the peak of the dV/dQ curve has collapsed.

As described above, a mode for carrying out the present invention has been described using the embodiments, but the present invention is not limited to such embodiments at all, and various modifications and replacements can be added within a range not departing from the gist of the present invention.

What is claimed is:

1. A resistance calculation device comprising:

a storage device that stores a program; and a processor that executes the program stored in the storage device to:

acquire an opening end potential curve for each single electrode before deterioration of a deteriorated secondary battery by a differential analysis of a voltage and a capacity and charging and discharging curve fitting;

calculate a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and to calculate a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point;

calculate an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit; and calculate a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit; and outputting, via a display device operatively connected to the resistance calculation device, information indicative of an analysis result, determined by the resistance calculation device, to an occupant of a vehicle.

2. The resistance calculation device according to claim 1, wherein the equivalent circuit includes a constituent having impedance.

3. A resistance calculation method that is executed by a computer of a resistance calculation device, the method comprising:

acquiring an opening end potential curve for each single electrode before deterioration of a deteriorated secondary battery by a differential analysis of a voltage and a capacity and charging and discharging curve fitting;

calculating a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode, and calculating a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point;

calculating an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit;

calculating a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit; and outputting, via a display device operatively connected to the resistance calculation device, information indicative of an analysis result, determined by the resistance calculation device, to an occupant of a vehicle.

4. A computer-readable non-transitory recording medium that includes a program causing a computer to execute:

acquiring an opening end potential curve for each single electrode before deterioration of a deteriorated secondary battery by a differential analysis of a voltage and a capacity and charging and discharging curve fitting;

calculating a shrinkage rate for each single electrode based on a capacity shift amount of a positive electrode of the deteriorated secondary battery, a capacity shift amount of a negative electrode of the deteriorated secondary battery, a deterioration amount of the positive electrode, and a deterioration amount of the negative electrode;

calculating a curve representing characteristics of a state of charge and an open circuit voltage of an equivalent circuit of the deteriorated secondary battery by deforming the opening end potential curve for each single electrode before deterioration of the deteriorated secondary battery by the shrinkage rate for each single electrode based on a fixed point;

calculating an amount of change in the open circuit voltage of the equivalent circuit to which a pulse current is applied based on a difference between the opening end potential curve for each single electrode before the deterioration and the curve representing the characteristics of the state of charge and the open circuit voltage of the equivalent circuit, calculating a DC resistance of the equivalent circuit by dividing a result of addition of an amount of change in a DC voltage of the equivalent circuit to which the pulse current is applied and the amount of change in the open circuit voltage of the equivalent circuit by a current value when the pulse current is applied to the equivalent circuit; and outputting, via a display device, information indicative of an analysis result, determined by the program, to an occupant of a vehicle.

5. The resistance calculation device of claim 1, wherein a human machine interface comprises the display device.

\* \* \* \* \*